(12) United States Patent
Lu

(10) Patent No.: US 10,886,149 B2
(45) Date of Patent: Jan. 5, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/264,607

(22) Filed: Jan. 31, 2019

(65) Prior Publication Data

US 2020/0251353 A1 Aug. 6, 2020

(51) Int. Cl.
*H01L 21/56* (2006.01)
*H01L 23/31* (2006.01)
*H01L 21/48* (2006.01)
*H01L 23/00* (2006.01)

(52) U.S. Cl.
CPC ........ *H01L 21/563* (2013.01); *H01L 21/4853* (2013.01); *H01L 21/565* (2013.01); *H01L 23/3128* (2013.01); *H01L 23/3185* (2013.01); *H01L 24/16* (2013.01); *H01L 2224/16227* (2013.01)

(58) Field of Classification Search
CPC ..... H01L 21/563; H01L 21/565; H01L 24/16; H01L 23/3185; H01L 23/3128; H01L 21/4853; H01L 2224/16227
See application file for complete search history.

(56) References Cited

U.S. PATENT DOCUMENTS

| 8,928,153 | B2* | 1/2015 | Haba ...................... H01L 25/16 257/777 |
| 10,163,854 | B2* | 12/2018 | Wang .................. H01L 23/5389 |
| 10,504,824 | B1* | 12/2019 | Pan .......................... H01L 24/97 |
| 2014/0306354 | A1* | 10/2014 | Shin ..................... H01L 23/3142 257/777 |
| 2016/0260695 | A1* | 9/2016 | Chung .................... H01L 25/18 |
| 2017/0178988 | A1* | 6/2017 | Cheney ............ H01L 23/49838 |
| 2018/0337134 | A1* | 11/2018 | Mitsukura ............... H01L 24/19 |

FOREIGN PATENT DOCUMENTS

KR       10-1778395 B1    9/2017

* cited by examiner

*Primary Examiner* — Yasser A Abdelaziez
(74) *Attorney, Agent, or Firm* — Foley & Lardner LLP

(57) ABSTRACT

A semiconductor device package includes a substrate, a semiconductor device, and an underfill. The semiconductor device is disposed on the substrate. The semiconductor device includes a first lateral surface. The underfill is disposed between the substrate and the semiconductor device. The underfill includes a first lateral surface. The first lateral surface of the underfill and the first lateral surface of the semiconductor device are substantially coplanar.

17 Claims, 28 Drawing Sheets

SEMICONDUCTOR DEVICE PACKAGE AND METHOD OF MANUFACTURING THE SAME

BACKGROUND

1. Technical Field

The present disclosure relates to a semiconductor device package including an underfill and a semiconductor device and a method of manufacturing the same.

2. Description of the Related Art

As miniaturization of semiconductor device packages progress, the density of internal wires in a semiconductor device package increase (or the pitch of the internal wires is reduced). However, due to the process constraint for manufacturing an underfill, the underfill may bleed and a relatively larger area of a substrate is occupied for the bled underfill, which will hinder the miniaturization of the semiconductor device package. In addition, a singulation path may be occupied by the bled underfill which will decrease the reliability of the semiconductor device package.

SUMMARY

In some embodiments, according to one aspect, a semiconductor device package includes a substrate, a semiconductor device, and an underfill. The semiconductor device is disposed on the substrate. The semiconductor device includes a first lateral surface. The underfill is disposed between the substrate and the semiconductor device. The underfill includes a first lateral surface. The first lateral surface of the underfill and the first lateral surface of the semiconductor device are substantially coplanar.

In some embodiments, according to one aspect, a semiconductor device package includes a substrate, a first semiconductor device, a first underfill, a second semiconductor device, and a second underfill. The first semiconductor device is disposed on the substrate. The first semiconductor device includes a first lateral surface substantially perpendicular to the substrate. The first underfill is disposed between the substrate and the first semiconductor device. The first underfill includes a first lateral surface substantially coplanar to the first lateral surface of the first semiconductor device. The second semiconductor device is disposed on the substrate. The second semiconductor device includes a first surface substantially perpendicular to the substrate. The second underfill is disposed between the substrate and the second semiconductor device. The second underfill includes a first lateral surface substantially coplanar to the first lateral surface of the second semiconductor device. The first lateral surface of the first semiconductor device faces the first lateral surface of the second semiconductor device.

In some embodiments, according to another aspect, a method is disclosed for manufacturing a semiconductor device package. The method includes: disposing a substrate with an electrical connection structure; forming an alignment structure on the substrate; injecting a fluid on the substrate; bonding a semiconductor device to the substrate, the semiconductor device including an electrical connection structure; and disposing an underfill between the substrate and the semiconductor device, wherein at least one side of the underfill is formed against the alignment structure.

DETAILED DESCRIPTION

Figure 1A:
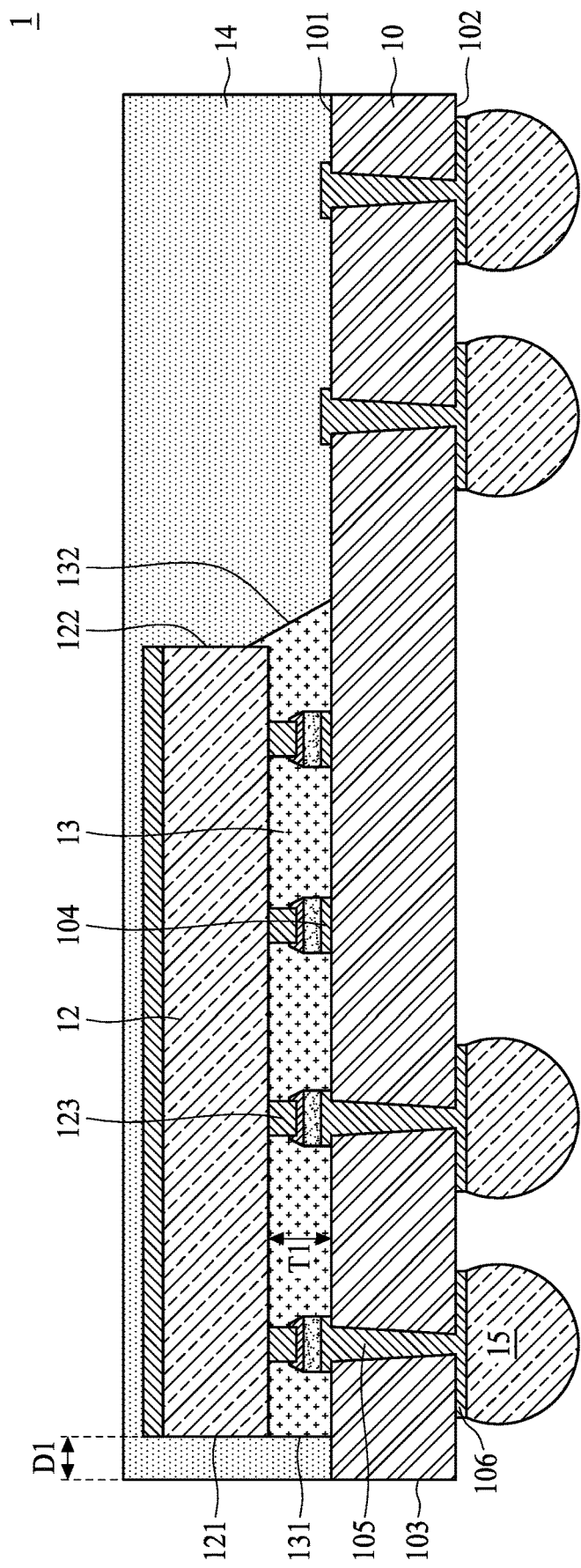
FIG. 1A illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a semiconductor device package 1 in accordance with some embodiments of the present disclosure. The semiconductor device package 1 includes a substrate 10, a semiconductor device 12, an underfill 13, an encapsulant 14, and a conductive element 15.

The substrate 10 has an upper surface 101 and a lower surface 102 opposite to the upper surface 101. The substrate 10 has a lateral surface 103 between the upper surface 101 and the lower surface 102. The substrate 10 has a conductive pad 104 disposed on the upper surface 101 and a conductive pad 106 disposed on the lower surface 102. The substrate 10 has an interconnection element 105 (e.g. a through via) disposed between the conductive pads 104 and 106 to provide an electrical connection therebetween. For example, the conductive pad 104 is electrically connected to the conductive pad 106 through the interconnection element 105. The substrate 10 may include one or more conductive layers. The substrate 10 may include a solder mask layer. The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL).

The conductive element 15 is disposed on the lower surface 102 of the substrate 10. The conductive element 15 is disposed on the conductive pad 106. In some embodiments, the conductive element 15 may be a Controlled Collapse Chip Connection (C4) bump, solder bump, a Ball Grid Array (BGA), Land Grid Arrays (LGA), pillar, or a combination of two or more thereof.

The semiconductor device 12 is disposed on the upper surface 101 of the substrate 10. The semiconductor device 12 has a lateral surface 121 and a lateral surface 122 opposite to the lateral surface 121. The lateral surfaces 121 and 122 of the semiconductor device 12 are substantially perpendicular to the upper surface 101 of the substrate 10. The semiconductor device 12 includes a conductive pad 123. The conductive pad 123 is electrically connected to the conductive pad 104. The semiconductor device 12 is a flip-chip type semiconductor device. The semiconductor device 12 may include an application-specific integrated circuit (ASIC), a controller, a processor or other electronic component or semiconductor device.

The underfill 13 is disposed between the semiconductor device 12 and the substrate 10. The underfill 13 surrounds or covers the conductive pad 123 of the semiconductor device 12. The underfill 13 has a lateral surface 131 and a lateral surface 132 opposite to the lateral surface 131. The lateral surface 131 of the underfill 13 is substantially perpendicular to the upper surface 101 of the substrate 10. The lateral surface 131 of the underfill 13 and the lateral surface 121 of the semiconductor device 12 are substantially coplanar. The lateral surface 132 of the underfill 13 partially covers the lateral surface 122 of the semiconductor device 12. The lateral surface 132 and the lateral surface 122 are discontinuous. For example, the lateral surface 132 is not coplanar with the lateral surface 122. For example, the lateral surface 132 is slanted with respect to the surface 122. For example, the lateral surface 132 and the upper surface 101 of the substrate 10 define an angle less than 90 degrees.

In some embodiments, a horizontal distance D1 between the lateral surface 103 of the substrate 10 and the lateral surface 121 of the semiconductor device 12 is less than 0.5 mm. For example, the distance D1 may be 0.4 mm, 0.3 mm, 0.2 mm, 0.1 mm or approach zero. Under such arrangement, the distance D1 may be precisely adjusted and the area of the substrate 10 occupied by the underfill 13 may be decreased. The total area of the substrate 10 may be utilized effectively, which will facilitate the miniaturization of the semiconductor device package 1. The underfill 13 has a thickness T1 extending from an active surface of the semiconductor device 12 to the upper surface 101 of the substrate 10. The thickness T1 is in a range approximately from 20 µm to 50 µm. The used volume of the underfill 13 may be precisely controlled to a minimum volume, which will reduce the manufacturing cost.

The encapsulant 14 is disposed on the upper surface 101 of the substrate 10. The encapsulant 14 encapsulates the semiconductor device 12 and the underfill 13. In some embodiments, a backside of the semiconductor device 12 may be fully covered by the encapsulant 14. In other embodiments, the backside of the semiconductor device 12 may be substantially coplanar to an upper surface of the encapsulant 14. For example, the backside of the semiconductor device 12 may be exposed from the encapsulant 14. A thickness of the encapsulant 14 may be flexibly designed.

Figure 1B:
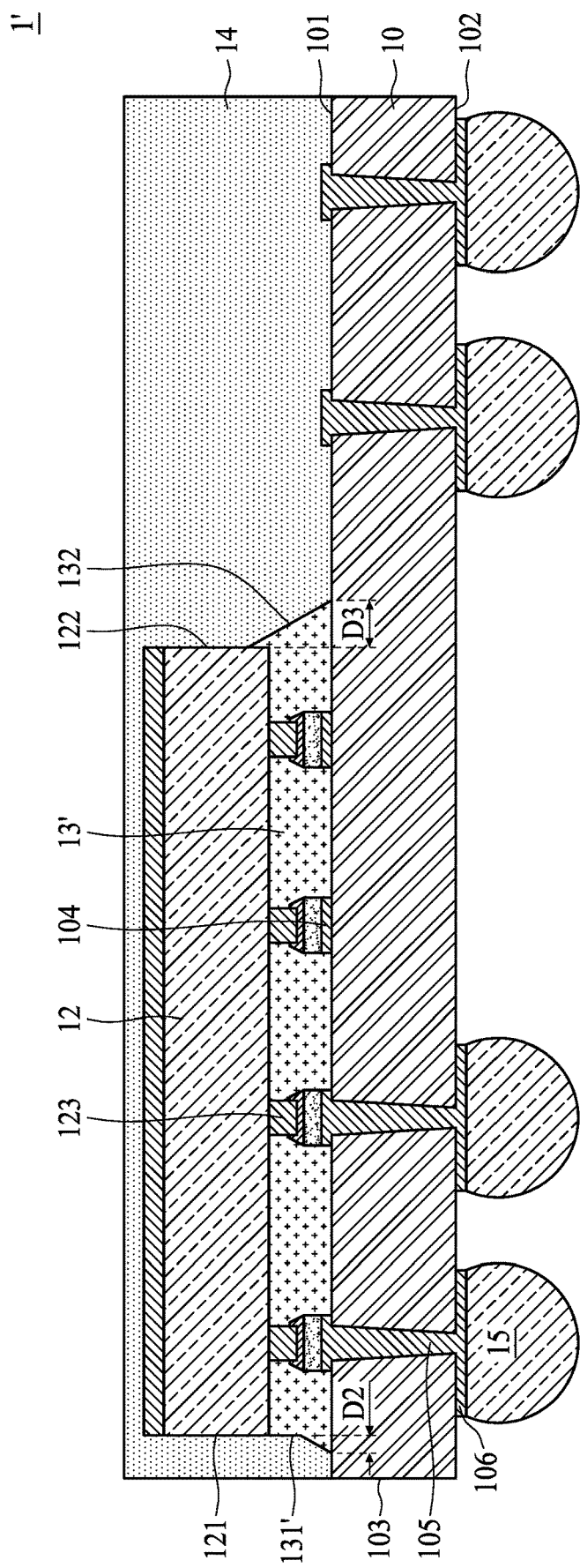
FIG. 1B illustrates a cross-sectional view of a semiconductor device package according to some embodiments of the present disclosure.

FIG. 1B is a cross-sectional view of a semiconductor device package 1' in accordance with some embodiments of the present disclosure. The semiconductor device package 1' is similar to the semiconductor device package 1 in FIG. 1A except that a lateral surface 131' of an underfill 13' includes a vertical portion and a sloped portion. The vertical portion of the lateral surface 131' of the underfill 13' is coplanar with the lateral surface 121 of the semiconductor device 12 and in contact with the semiconductor device 12. The sloped portion of the lateral surface 131' of the underfill 13' is slanted outwardly in a direction from the semiconductor device 12 to the substrate 10.

A horizontal distance D2 between a left end of the underfill 13' and the lateral surface 121 of the semiconductor device 12 is less than a horizontal distance D3 between a right end of the underfill 13' and the lateral surface 122 of the semiconductor device 12.

The appearance of the underfill 13' may be affected by an alignment structure (not shown in FIG. 1B). In some embodiments, the alignment structure may include a photosensitive material or other suitable materials. The alignment structure may be a photoresist.

Figure 1C:
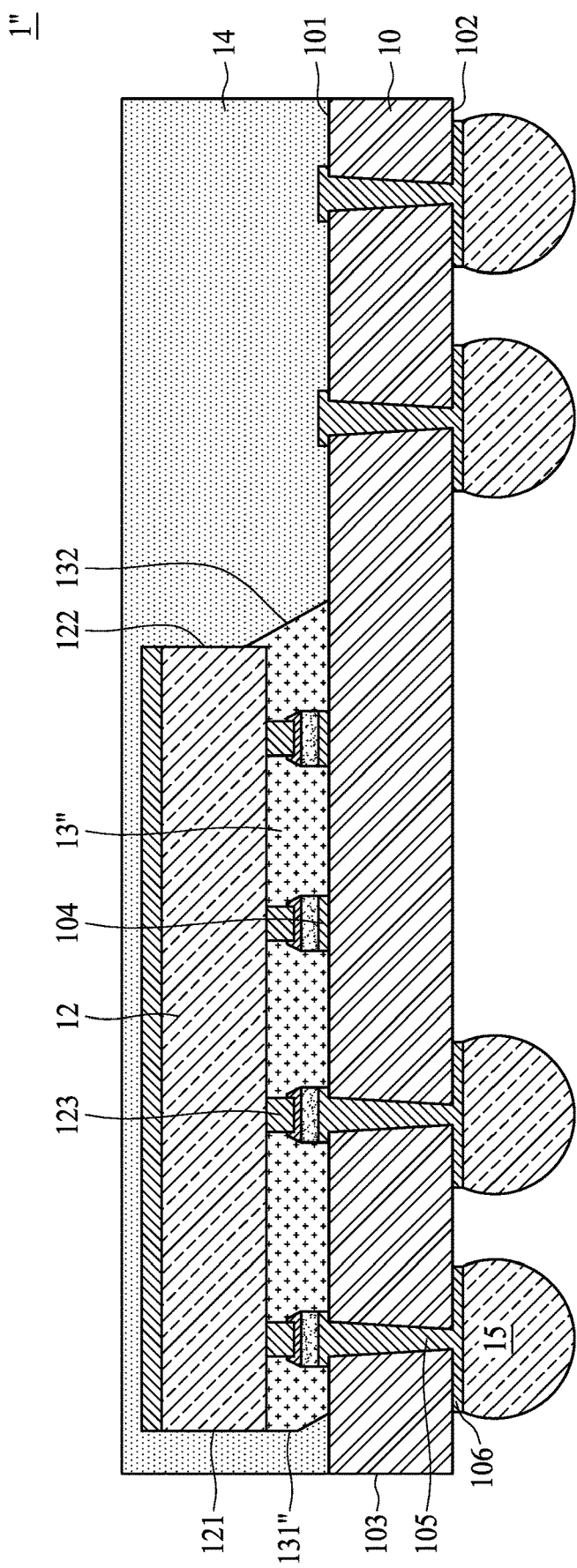
FIG. 1C illustrates a cross-sectional view of a semiconductor device package according to some embodiments of the present disclosure.

FIG. 1C is a cross-sectional view of a semiconductor device package 1" in accordance with some embodiments of the present disclosure. The semiconductor device package 1" is similar to the semiconductor device package 1 in FIG. 1A except that a lateral surface 131" of an underfill 13" includes a vertical portion and a sloped portion. The vertical portion of the lateral surface 131" of the underfill 13" is coplanar with the lateral surface 121 of the semiconductor device 12 and in contact with the semiconductor device 12. The sloped portion of the lateral surface 131" of the underfill 13" shrinks inwardly in a direction from the semiconductor device 12 to the substrate 10.

The appearance of the underfill 13" may be affected by an alignment structure (not shown in FIG. 1C). In some embodiments, the alignment structure may include a photosensitive material or other suitable materials. The alignment structure may be a photoresist.

Figure 1D:
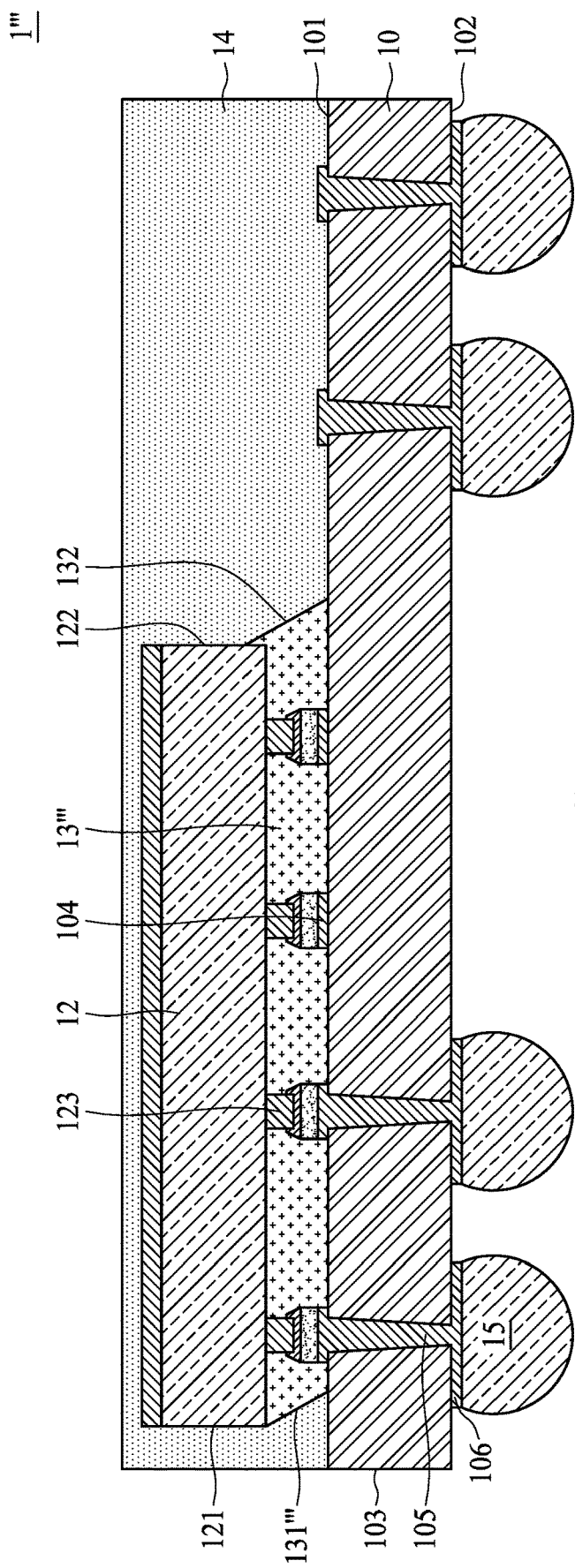
FIG. 1D illustrates a cross-sectional view of a semiconductor device package according to some embodiments of the present disclosure.

FIG. 1D is a cross-sectional view of a semiconductor device package 1''' in accordance with some embodiments of the present disclosure. The semiconductor device package 1''' is similar to the semiconductor device package 1 in FIG.

1A except that a lateral surface 131''' of an underfill 13''' is a sloped lateral surface. The lateral surface 131''' of the underfill 13''' shrinks inwardly in a direction from the semiconductor device 12 to the substrate 10.

The appearance of the underfill 13''' may be affected by an alignment structure (not shown in FIG. 1D). In some embodiments, the alignment structure may include a photosensitive material or other suitable materials. The alignment structure may be a photoresist.

Figure 2A:
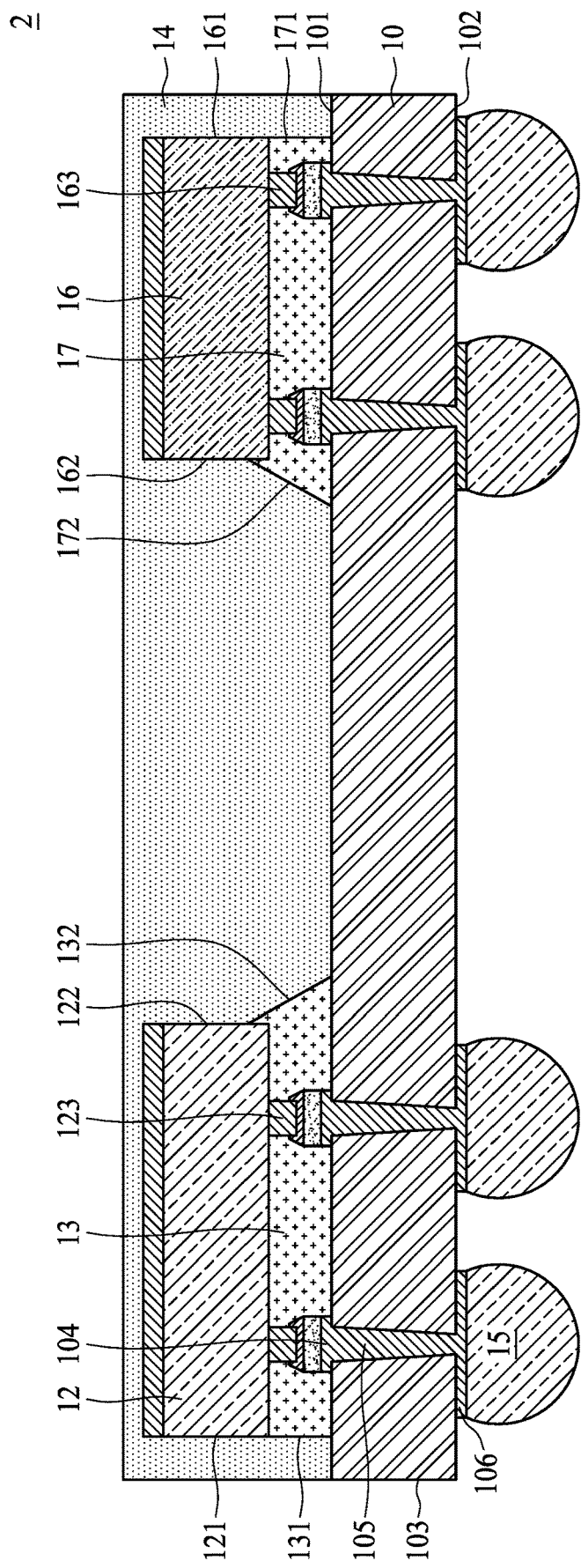
FIG. 2A illustrates a cross-sectional view of a semiconductor device package according to some embodiments of the present disclosure.

FIG. 2A is a cross-sectional view of a semiconductor device package 2 in accordance with some embodiments of the present disclosure. The semiconductor device package 2 includes a substrate 10, semiconductor devices 12 and 16, underfills 13 and 17, an encapsulant 14, and a conductive element 15.

The arrangement of the semiconductor device 12 and underfill 13 is similar to the arrangement illustrated in FIG. 1A. The arrangement of the semiconductor device 16 and underfill 17 is similar to the arrangement of the semiconductor 12 and underfill 13.

The semiconductor device 16 is disposed on the upper surface 101 of the substrate 10. The semiconductor device 16 has a lateral surface 161 and a lateral surface 162 opposite to the lateral surface 161. The lateral surfaces 161 and 162 of the semiconductor device 16 are substantially perpendicular to the upper surface 101 of the substrate 10. The semiconductor device 16 includes a conductive pad 163. The conductive pad 163 is electrically connected to the conductive pad 104. The semiconductor device 16 is a flip-chip type semiconductor device. The semiconductor device 16 may include an application-specific integrated circuit (ASIC), a controller, a processor or other electronic component or semiconductor device. The semiconductor device 16 may be different from or the same as the semiconductor device 12.

The underfill 17 is disposed between the semiconductor device 16 and the substrate 10. The underfill 17 surrounds or covers the conductive pad 163 of the semiconductor device 16. The underfill 17 has a lateral surface 171 and a lateral surface 172 opposite to the lateral surface 171. The lateral surface 171 of the underfill 17 is substantially perpendicular to the upper surface 101 of the substrate 10. The lateral surface 171 of the underfill 17 and the lateral surface 161 of the semiconductor device 16 are substantially coplanar. The lateral surface 172 of the underfill 17 partially covers the lateral surface 162 of the semiconductor device 16. The semiconductor device 16 may be arranged to be close to the semiconductor device 12. The lateral surface 172 and the lateral surface 162 are discontinuous. For example, the lateral surface 172 is not coplanar with the lateral surface 162. For example, the lateral surface 172 is slanted with respect to the surface 162. For example, the lateral surface 172 and the upper surface 101 of the substrate 10 define an angle less than 90 degrees.

The encapsulant 14 encapsulates the semiconductor device 12 and the underfill 13. The encapsulant 14 encapsulates the semiconductor device 16 and the underfill 17. In some embodiments, a backside of the semiconductor device 12 or 16 may be fully covered by the encapsulant 14. In other embodiments, the backside of the semiconductor device 12 and a backside of the semiconductor device 16 may be substantially coplanar to an upper surface of the encapsulant 14. For example, the backside of the semiconductor device 12 and the backside of the semiconductor device 16 may be exposed from the encapsulant 14. A thickness of the encapsulant 14 may be flexibly designed. In some embodiments, the encapsulant 14 may be omitted.

Figure 2B:
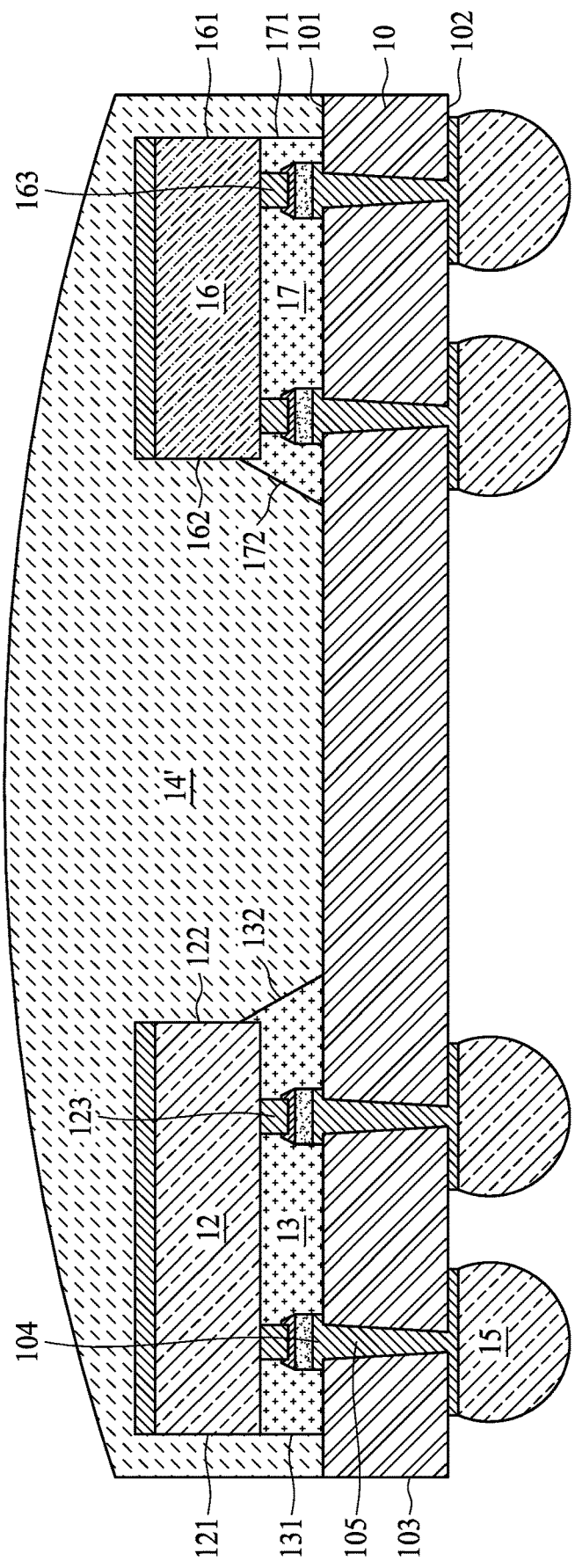
FIG. 2B illustrates a cross-sectional view of a semiconductor device package according to some embodiments of the present disclosure.

FIG. 2B is a cross-sectional view of a semiconductor device package 2' in accordance with some embodiments of the present disclosure. The semiconductor device package 2' is similar to the semiconductor device package 2 in FIG. 2A except that an encapsulant 14' has a curved upper surface.

The encapsulant 14' is formed by a potting operation. The encapsulant 14' encapsulates the semiconductor device 12 and the underfill 13. The encapsulant 14' encapsulates the semiconductor device 16 and the underfill 17. In some embodiments, the material of the encapsulant 14' may be the same as those of underfills 13 and 17. The material of the encapsulant 14' may be different from those of underfills 13 and 17.

Figure 2C:
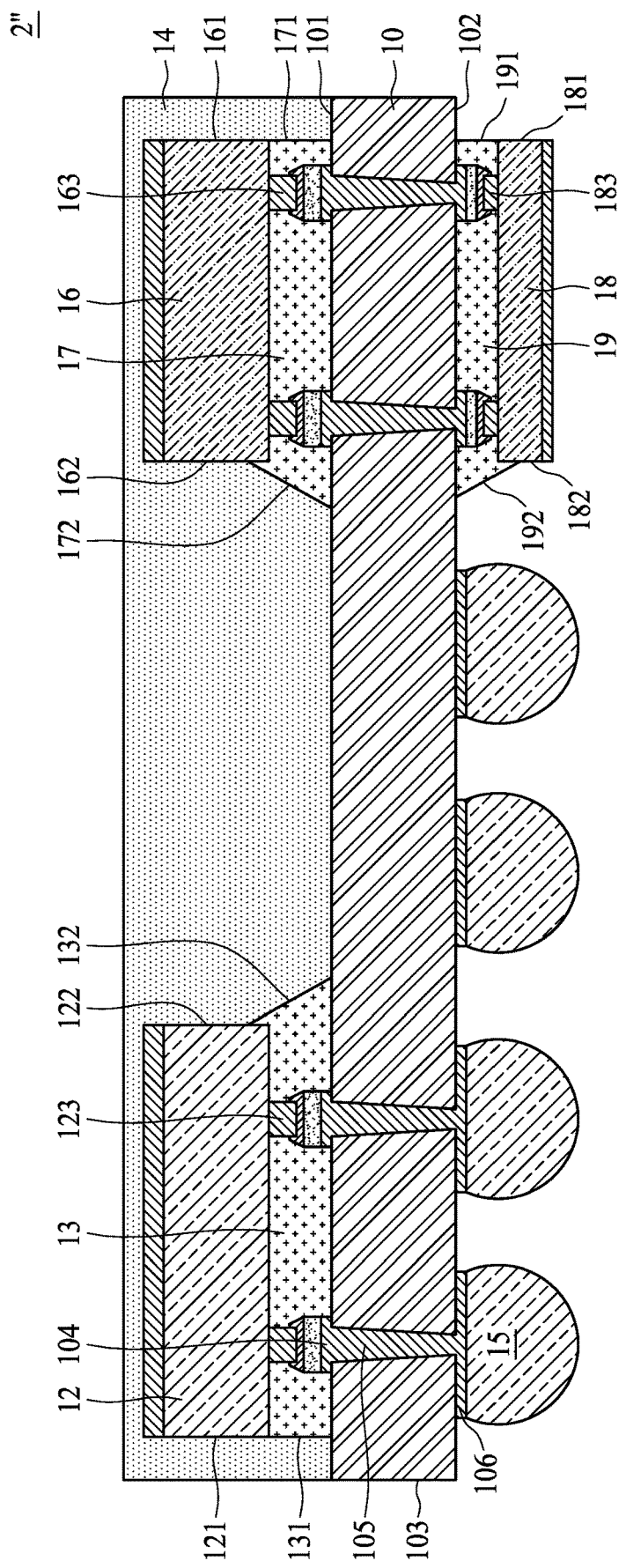
FIG. 2C illustrates a cross-sectional view of a semiconductor device package according to some embodiments of the present disclosure.

FIG. 2C is a cross-sectional view of a semiconductor device package 2'' in accordance with some embodiments of the present disclosure. The semiconductor device package 2'' is similar to the semiconductor device package 2 in FIG. 2A except that the semiconductor device package 2'' further includes a semiconductor device 18 and an underfill 19 disposed on the lower surface 102 of the substrate 10. The semiconductor device package 2'' is a double-sided package.

The semiconductor device 18 has a lateral surface 181 and a lateral surface 182 opposite to the lateral surface 181. The lateral surfaces 181 and 182 of the semiconductor device 18 are substantially perpendicular to the lower surface 102 of the substrate 10. The semiconductor device 18 includes a conductive pad 183. The conductive pad 183 is electrically connected to the conductive pad 106. The semiconductor device 18 is a flip-chip type semiconductor device. The semiconductor device 18 may include an application-specific integrated circuit (ASIC), a controller, a processor or other electronic component or semiconductor device. In some embodiments, the semiconductor device 18 may be the same as the semiconductor device 12 or 16. The semiconductor device 18 may be different from the semiconductor device 12 or 16.

The underfill 19 is disposed between the semiconductor device 18 and the substrate 10. The underfill 19 surrounds or covers the conductive pad 183 of the semiconductor device 18. The underfill 19 has a lateral surface 191 and a lateral surface 192 opposite to the lateral surface 191. The lateral surface 191 of the underfill 19 is substantially perpendicular to the lower surface 102 of the substrate 10. The lateral surface 191 of the underfill 19 and the lateral surface 181 of the semiconductor device 18 are substantially coplanar. The lateral surface 192 of the underfill 19 partially covers the lateral surface 182 of the semiconductor device 18. The lateral surface 192 and the lateral surface 182 are discontinuous. For example, the lateral surface 192 is not coplanar with the lateral surface 182. For example, the lateral surface 192 is slanted with respect to the surface 182. For example, the lateral surface 192 and the lower surface 102 of the substrate 10 define an angle less than 90 degrees.

Figure 3:
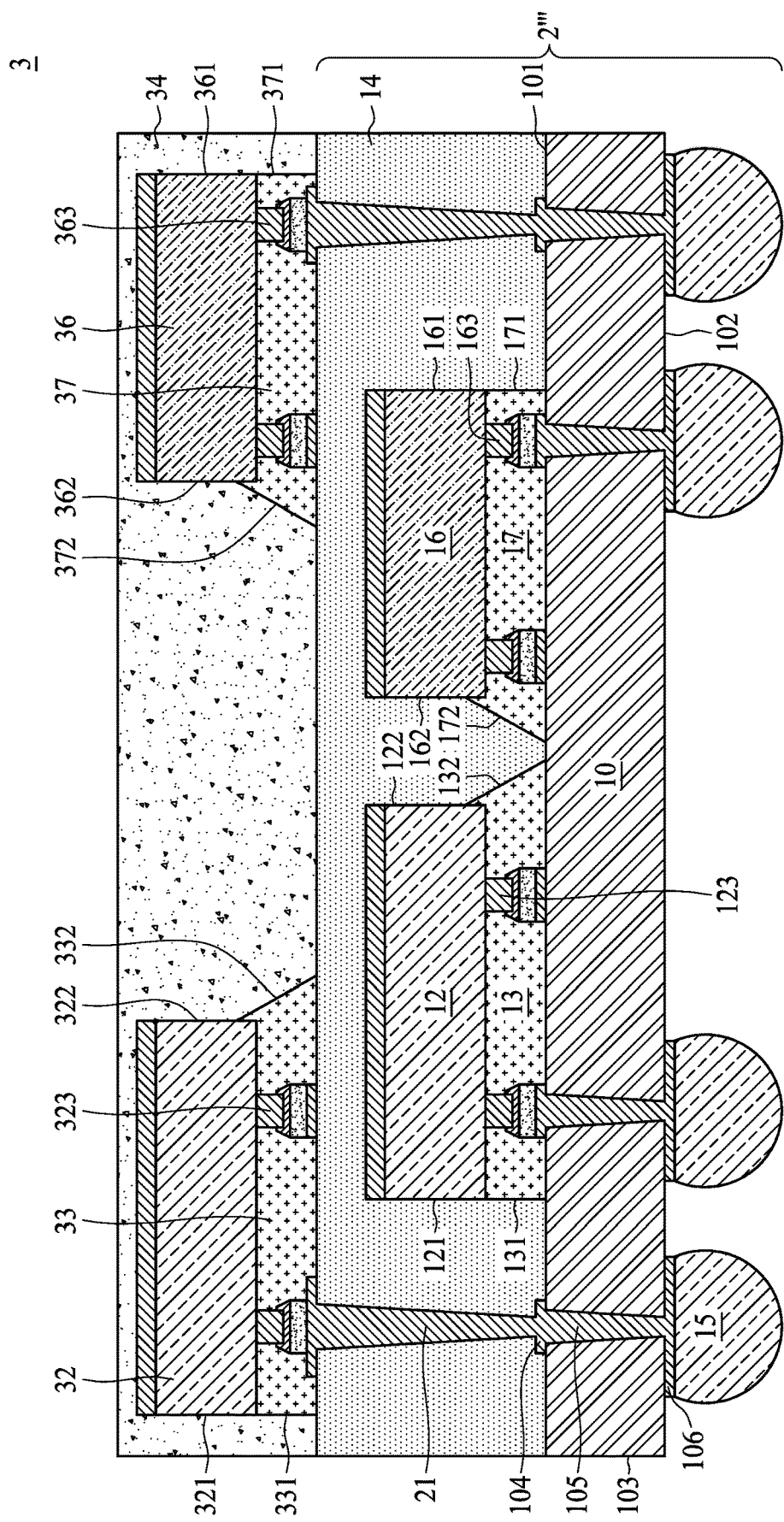
FIG. 3 illustrates a cross-sectional view of a semiconductor device package according to some embodiments of the present disclosure.

FIG. 3 is a cross-sectional view of a semiconductor device package 3 in accordance with some embodiments of the present disclosure. The semiconductor device package 3 includes a semiconductor device package 2''', semiconductor devices 32 and 36, and underfills 33 and 37. The semiconductor device package 2''' is similar to the semiconductor device package 2 in FIG. 2A except that interconnection elements 21 electrically connect the conductive pads 104 to the semiconductor devices 32 and 36. The semiconductor device package 3 is a multilayer package.

The semiconductor device 32 is disposed on the backside of the encapsulant 14. The semiconductor device 32 has a lateral surface 321 and a lateral surface 322 opposite to the lateral surface 321. The lateral surfaces 321 and 322 of the semiconductor device 32 are substantially perpendicular to the backside of the encapsulant 14. The semiconductor device 32 includes a conductive pad 323. The conductive pad 323 is electrically connected to the conductive pad 104 through the interconnection element 21. The semiconductor device 32 is a flip-chip type semiconductor device. The semiconductor device 32 may include an application-specific integrated circuit (ASIC), a controller, a processor or other electronic component or semiconductor device.

The underfill 33 is disposed between the semiconductor device 32 and the encapsulant 14. The underfill 33 covers or surrounds the conductive pad 323 of the semiconductor device 32. The underfill 33 has a lateral surface 331 and a lateral surface 332 opposite to the lateral surface 331. The lateral surface 331 of the underfill 33 is substantially perpendicular to the backside of the encapsulant 14. The lateral surface 331 of the underfill 33 and the lateral surface 321 of the semiconductor device 32 are substantially coplanar. The lateral surface 332 of the underfill 33 partially covers the lateral surface 322 of the semiconductor device 32. The lateral surface 332 and the lateral surface 322 are discontinuous. For example, the lateral surface 332 is not coplanar with the lateral surface 322. For example, the lateral surface 332 is slanted with respect to the surface 322. For example, the lateral surface 332 and an upper surface of the encapsulant 14 define an angle less than 90 degrees.

The semiconductor device 36 has a lateral surface 361 and a lateral surface 362 opposite to the lateral surface 361. The underfill 37 has a lateral surface 371 and a lateral surface 372 opposite to the lateral surface 371. The arrangement of the semiconductor device 36 and the underfill 37 is similar to the arrangement of the semiconductor device 32 and the underfill 33.

The encapsulant 34 is disposed on the backside of the encapsulant 14. The encapsulant 34 encapsulates the semiconductor device 32 and the underfill 33. The encapsulant 34 encapsulates the semiconductor device 36 and the underfill 37. In some embodiments, backsides of the semiconductor devices 32 and 36 may be fully covered by the encapsulant 14. In other embodiments, the backsides of the semiconductor devices 32 and 36 may be substantially coplanar with an upper surface of the encapsulant 34. For example, the backsides of the semiconductor devices 32 and 36 may be exposed from the encapsulant 34. A thickness of the encapsulant 34 may be flexibly designed.

Figure 4:
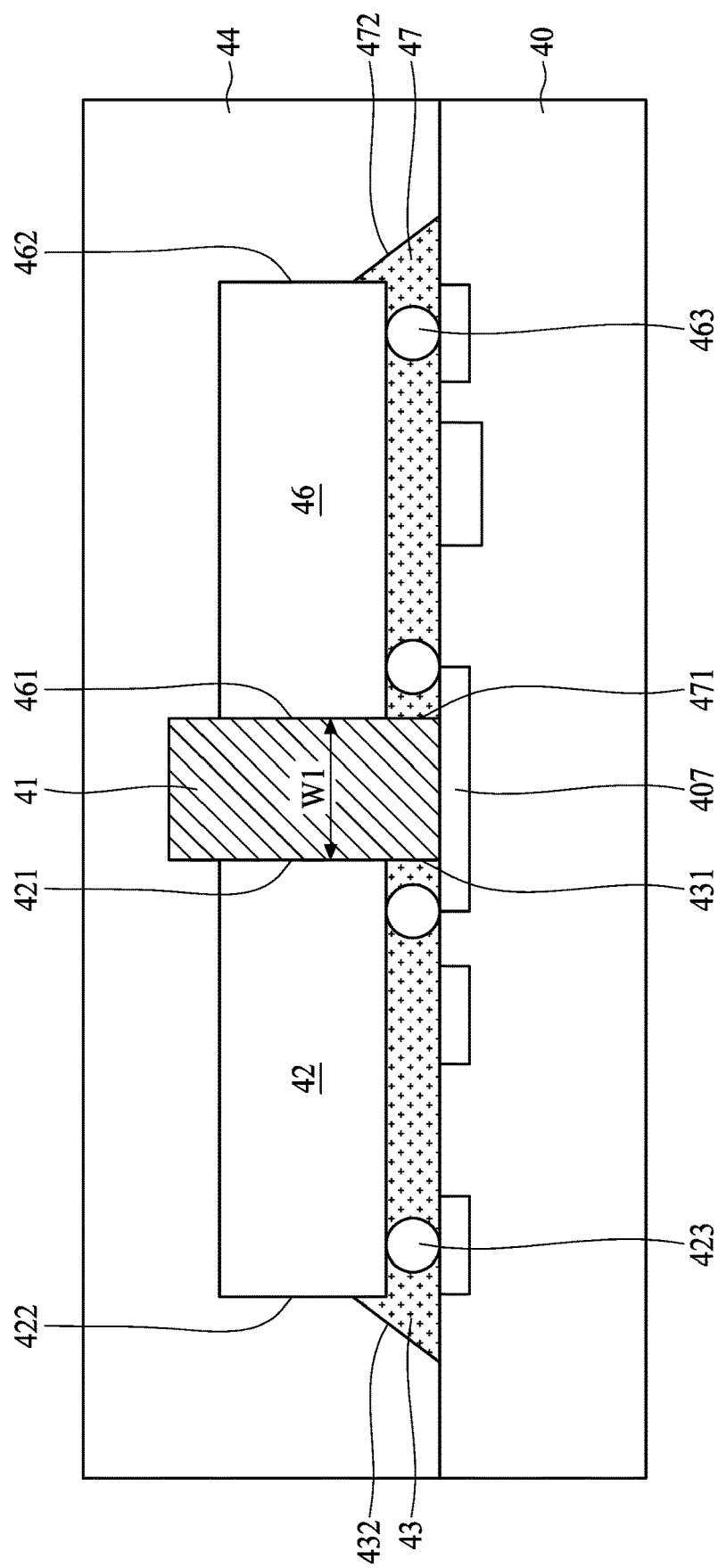
FIG. 4 illustrates a cross-sectional view of a semiconductor device package according to some embodiments of the present disclosure.

FIG. 4 is a cross-sectional view of a semiconductor device package 4 in accordance with some embodiments of the present disclosure. The semiconductor device package 4 includes a substrate 40, an alignment structure 41, semiconductor devices 42 and 46, underfills 43 and 47, and an encapsulant 44.

The substrate 40 has a conductive layer 407 adjacent to an upper surface of the substrate 40. The conductive layer 407 may be a patterned conductive layer. The substrate 40 may have a conductive pad disposed on the upper surface of the substrate 40. The conductive pad is electrically connected to the conductive layer 407. The substrate 40 may include a solder mask layer. The substrate 40 may be, for example, a printed circuit board (PCB), such as a paper-based copper foil laminate, a composite copper foil laminate, a polymer-impregnated glass-fiber-based copper foil laminate, or a combination of two or more thereof. In some embodiments, the substrate 40 may be a redistribution layer (RDL).

The semiconductor device 42 is disposed on the upper surface of the substrate 40. The semiconductor device 42 has a lateral surface 421 and a lateral surface 422 opposite to the lateral surface 421. The lateral surfaces 421 and 422 of the semiconductor device 42 are substantially perpendicular to the upper surface of the substrate 40. The semiconductor device 42 includes a conductive pad 423. The conductive pad 423 is electrically connected to the conductive layer 407 through the conductive pad of the substrate 40. The semiconductor device 42 is a flip-chip type semiconductor device. The semiconductor device 42 may include an application-specific integrated circuit (ASIC), a controller, a processor or other electronic component or semiconductor device.

The underfill 43 is disposed between the semiconductor device 42 and the substrate 40. The underfill 43 surrounds or covers the conductive pad 423 of the semiconductor device 42. The underfill 43 has a lateral surface 431 and a lateral surface 432 opposite to the lateral surface 431. The lateral surface 431 of the underfill 43 is substantially perpendicular to the upper surface of the substrate 40. The lateral surface 431 of the underfill 43 and the lateral surface 421 of the semiconductor device 42 are substantially coplanar. The lateral surface 432 of the underfill 43 partially covers the lateral surface 422 of the semiconductor device 42. The lateral surface 432 and the lateral surface 422 are discontinuous. For example, the lateral surface 432 is not coplanar with the lateral surface 422. For example, the lateral surface 432 is slanted with respect to the surface 422. For example, the lateral surface 432 and the upper surface 101 of the substrate 10 define an angle less than 90 degrees.

The semiconductor device 46 has a lateral surface 461 and a lateral surface 462 opposite to the lateral surface 461. The underfill 47 has a lateral surface 471 and a lateral surface 472 opposite to the lateral surface 471. The arrangement of the semiconductor device 46 and the underfill 47 is similar to the arrangement of the semiconductor device 42 and the underfill 43. The lateral surface 421 of the semiconductor device 42 faces the lateral surface 461 of the semiconductor device 46. The semiconductor device 42 and the semiconductor device 46 are electrically connected to each other through the conductive layer 407. The lateral surface 431 of the underfill 43 faces the lateral surface 471 of the underfill 47. In some embodiments, the semiconductor device 42 may be the same as or different from the semiconductor device 46.

The alignment structure 41 is disposed on the upper surface of the substrate 40. The alignment structure 41 is disposed between the semiconductor device 42 and the semiconductor device 46. The alignment structure 41 is in contact with the semiconductor device 42 and the underfill 43. The alignment structure 41 is in contact with the semiconductor device 46 and the underfill 47. In some embodiments, the alignment structure 41 may include a photosensitive material or other suitable materials. The alignment structure 41 may be a photoresist.

The alignment structure 41 has a width W1. The width W1 of the alignment structure 41 may be flexibly adjusted. Accordingly, the semiconductor devices 42 and 46 may be arranged to be as close as possible to facilitate signal communications between the semiconductor devices 42 and 46.

The encapsulant 44 encapsulates the semiconductor device 42 and the underfill 43. The encapsulant 44 encapsulates the semiconductor device 46 and the underfill 47. In some embodiments, backsides of the semiconductor devices 42 and 46 may be fully covered by the encapsulant 44. In other embodiments, an upper surface of the alignment structure 41 may be substantially coplanar to an upper surface of the encapsulant 44. In another embodiment, the upper surface of the alignment structure 41 and the backsides of the semiconductor devices 42 and 46 may be substantially coplanar to the upper surface of the encapsulant 44. Under this arrangement of the alignment structure 41, there would be no void in the encapsulant 44.

In some embodiments, the structure of FIG. 4 may be applied to a FOCoS (Fan Out Chip on Substrate) structure. The structure of FIG. 4 may be applied for chip-last operation so as to avoid underfill bleeding. Accordingly, a distance between two semiconductor devices may be shortened.

Figure 5C:
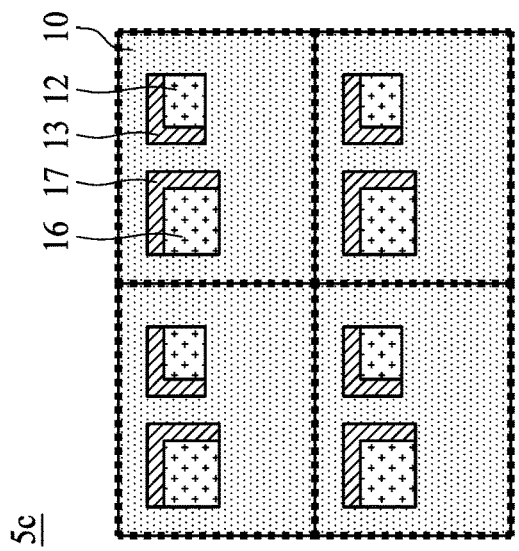
FIG. 5C illustrates a top view of a semiconductor device package according to some embodiments of the present disclosure.
Figure 5B:
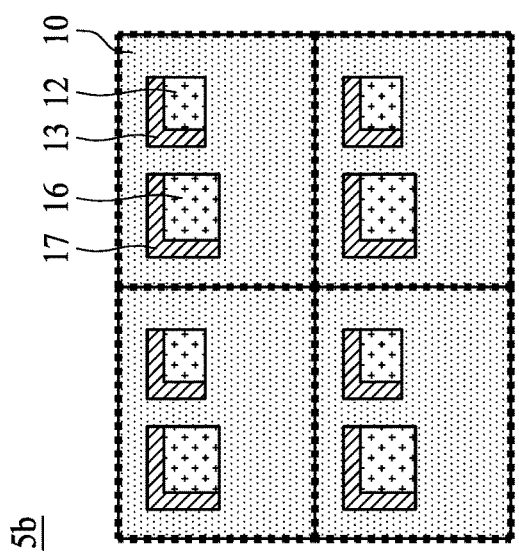
FIG. 5B illustrates a top view of a semiconductor device package according to some embodiments of the present disclosure.
Figure 5A:
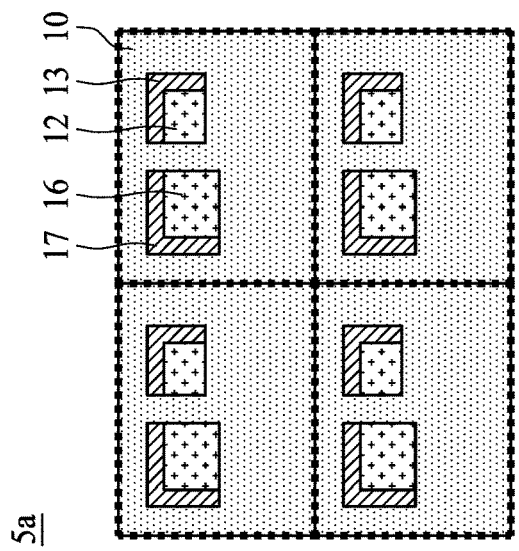
FIG. 5A illustrates a top view of a semiconductor device package according to some embodiments of the present disclosure.

FIG. 5A is a top view of a semiconductor device package 5a according to some embodiments of the present disclosure. The semiconductor device package 5a has four units. Each unit includes a substrate 10, semiconductor devices 12 and 16, and underfills 13 and 17. The semiconductor devices 12 and 16 are inwardly symmetrical. The underfill 13 does not bleed over the left side and the bottom side of the semiconductor device 12. The underfill 17 does not bleed over the right side and the bottom side of the semiconductor device 16.

FIG. 5B is a top view of a semiconductor device package 5b according to some embodiments of the present disclosure. The semiconductor device package 5b is similar to the semiconductor device package 5a in FIG. 5A except that the underfill 13 does not bleed over the right side and the bottom side of the semiconductor device 12 and the underfill 17 does not bleed over the right side and the bottom side of the semiconductor device 16.

FIG. 5C is a top view of a semiconductor device package 5c according to some embodiments of the present disclosure. The semiconductor device package 5c is similar to the semiconductor device package 5a in FIG. 5A except that the underfill 13 does not bleed over the right side and the bottom side of the semiconductor device 12 and the underfill 17 does not bleed over the left side and the bottom side of the semiconductor device 16. The semiconductor devices 12 and 16 are outwardly symmetrical.

Figure 5D:
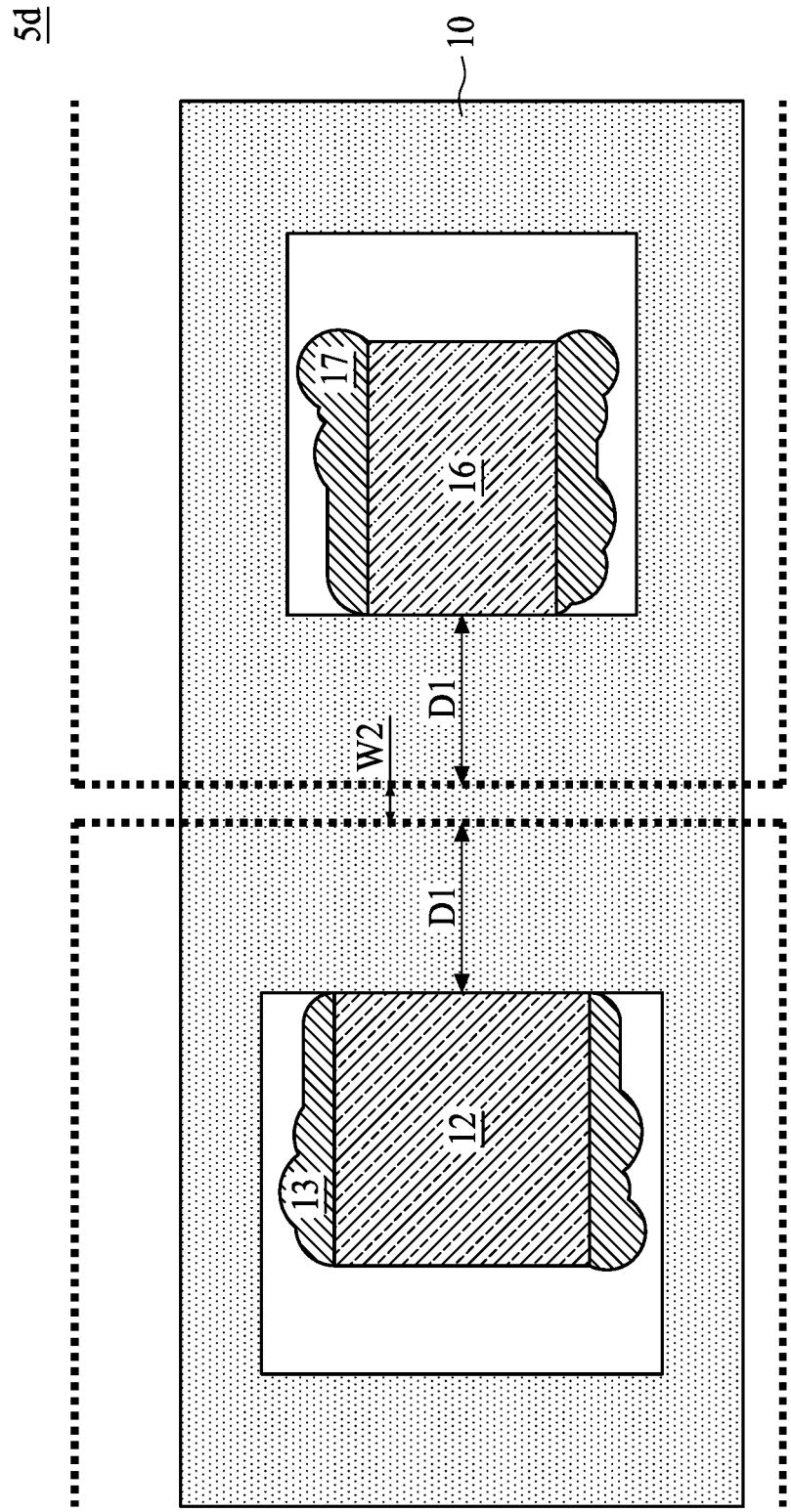
FIG. 5D illustrates a top view of a semiconductor device package according to some embodiments of the present disclosure.

FIG. 5D is a top view of a semiconductor device package 5d according to some embodiments of the present disclosure. The semiconductor device package 5d has two units. Each unit includes a substrate 10, semiconductor devices 12 and 16, and underfills 13 and 17. The underfill 13 does not bleed over the left side and the right side of the semiconductor device 12. The underfill 17 does not bleed over the left side and the right side of the semiconductor device 16.

The two units may be separated with a predefined singulation path. The predefined singulation path has a width W2. The width W2 is in a range from approximately 60 µm to approximately 100 µm. The semiconductor device 12 is spaced apart from the predefined singulation path by the distance D1. The semiconductor device 16 is spaced apart from the predefined singulation path by the distance D1. The distance D1 is less than 0.5 mm.

Figure 6B:
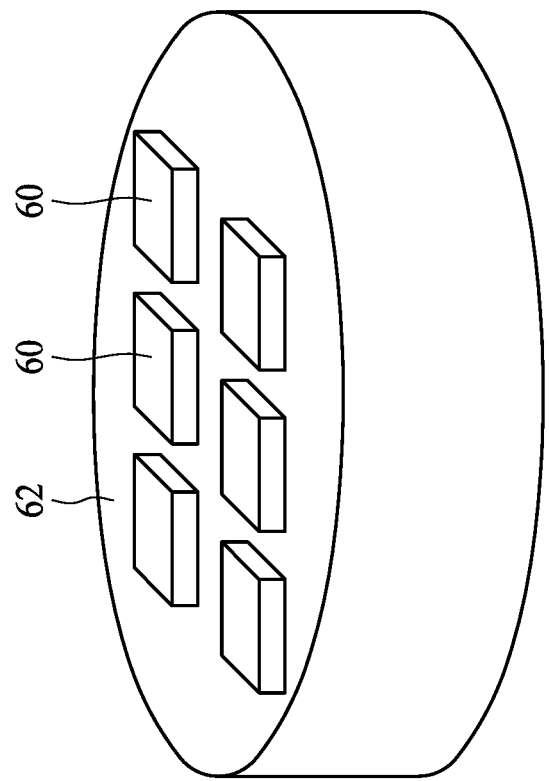
FIG. 6B illustrates a type of a carrier for semiconductor package structures in accordance with some embodiments of the present disclosure.
Figure 6A:
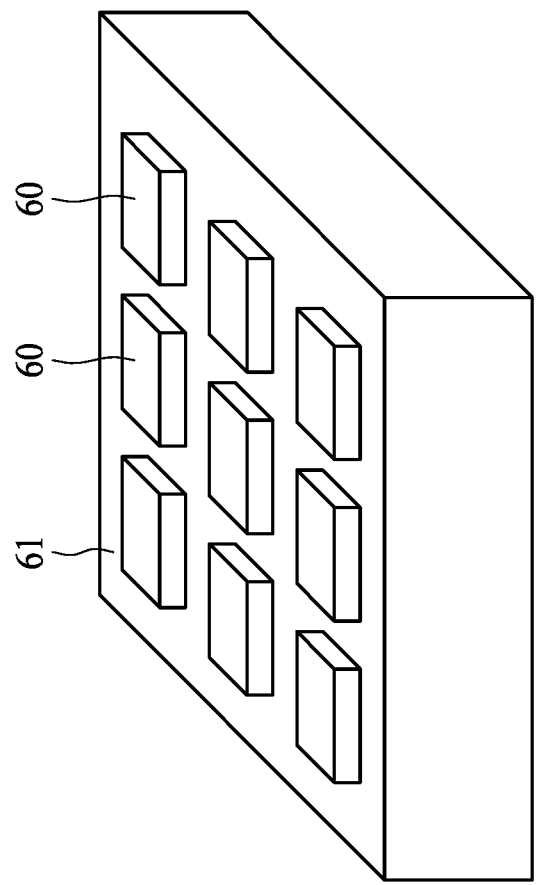
FIG. 6A illustrates a type of a carrier for semiconductor package structures in accordance with some embodiments of the present disclosure.

FIGS. 6A and 6B illustrate different types of semiconductor device packages in accordance with some embodiments of the present disclosure.

As shown in FIG. 6A, a plurality of chips 60 and/or dies are placed on a square-shaped carrier 61. In some embodiments, at least one of the chips 60 may include the semiconductor device package 1, 1', 1", 1''', 2, 2', 2", 3, 4, 5a, 5b, 5c and/or 5d as show in FIGS. 1A-1D, 2A-2C, 3, 4 and/or 5A-5D. In some embodiments, the carrier 61 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As shown in FIG. 6B, a plurality of chips 60 and/or dies are placed on a circle-shaped carrier 62. In some embodiments, at least one of the chips 60 may include the semiconductor device package 1, 1', 1", 1''', 2, 2', 2", 3, 4, 5a, 5b, 5c and/or 5d as show in FIGS. 1A-1D, 2A-2C, 3, 4 and/or 5A-5D. In some embodiments, the carrier 62 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

Figure 7A:
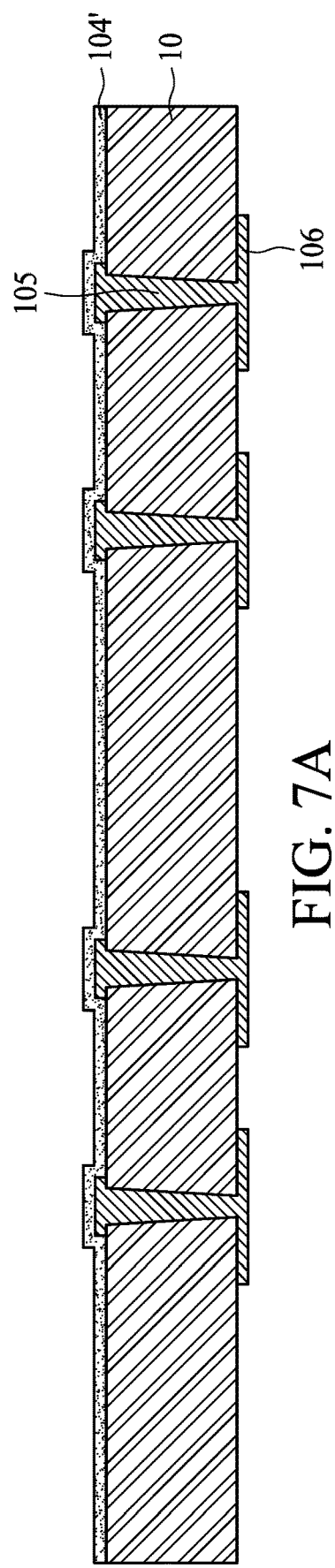
FIG. 7A, FIG. 7B, FIG. 7C, FIG. 7D, FIG. 7E, FIG. 7F, FIG. 7G, FIG. 7H, FIG. 7I, FIG. 7J, FIG. 7K, FIG. 7L, FIG. 7M, FIG. 7N, FIG. 7O, and FIG. 7P illustrate a method of manufacturing a semiconductor device package according to some embodiments of the present disclosure.
Figure 7B:
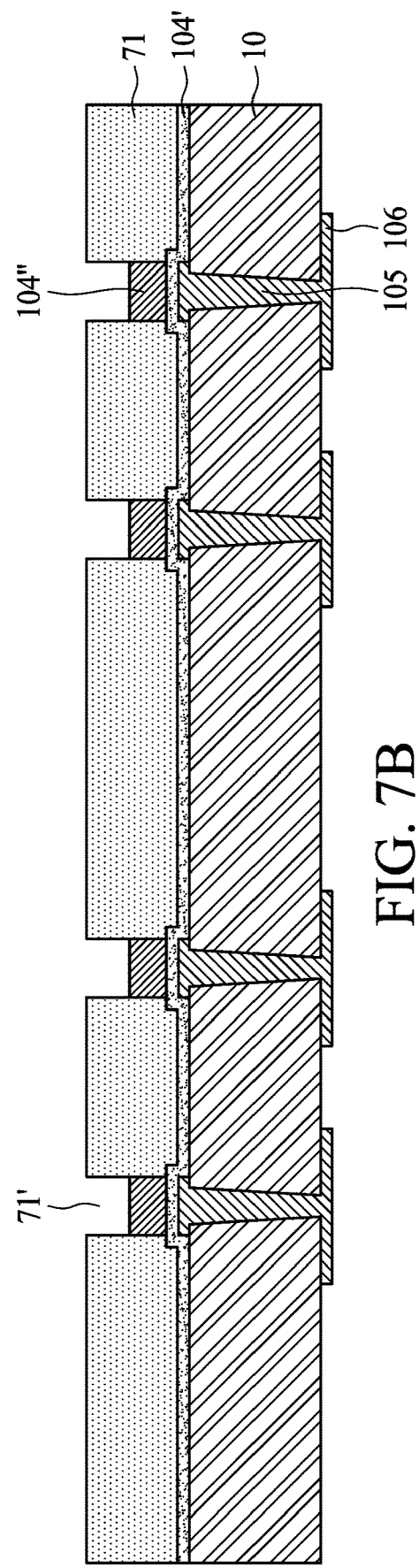
Figure 7C:
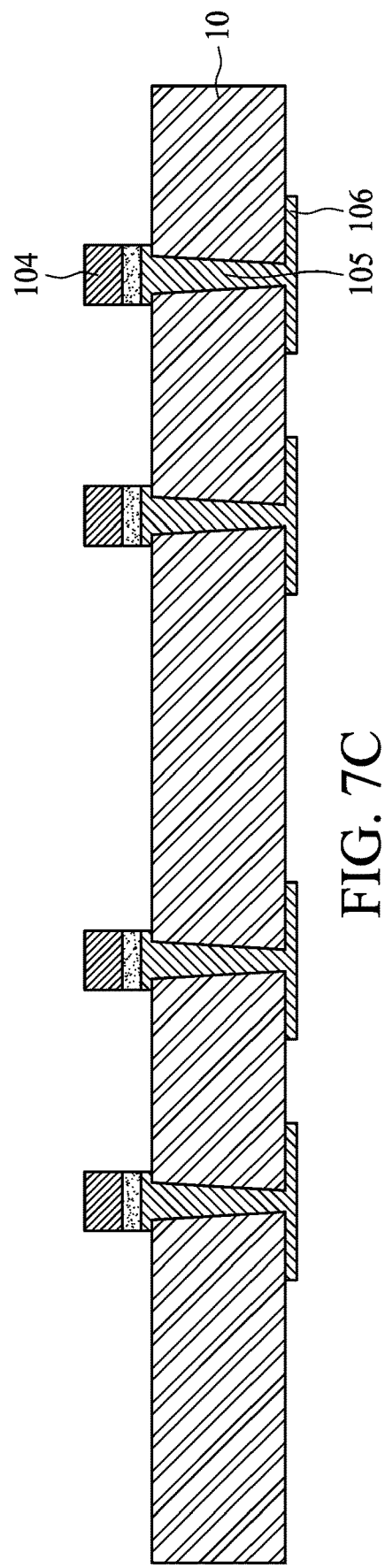
Figure 7D:
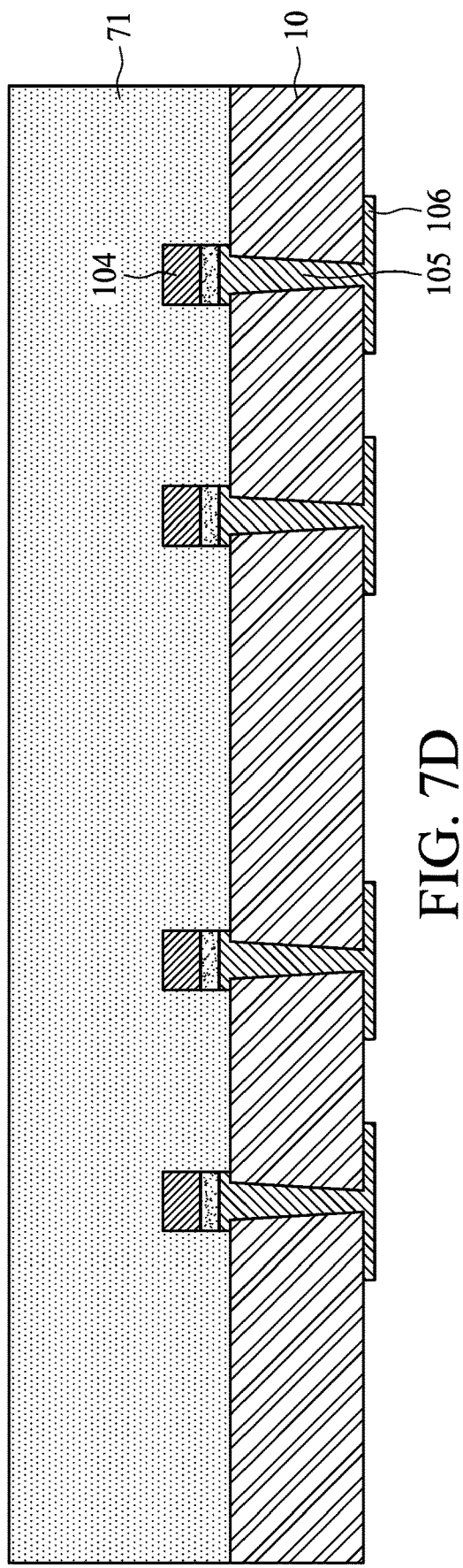
Figure 7E:
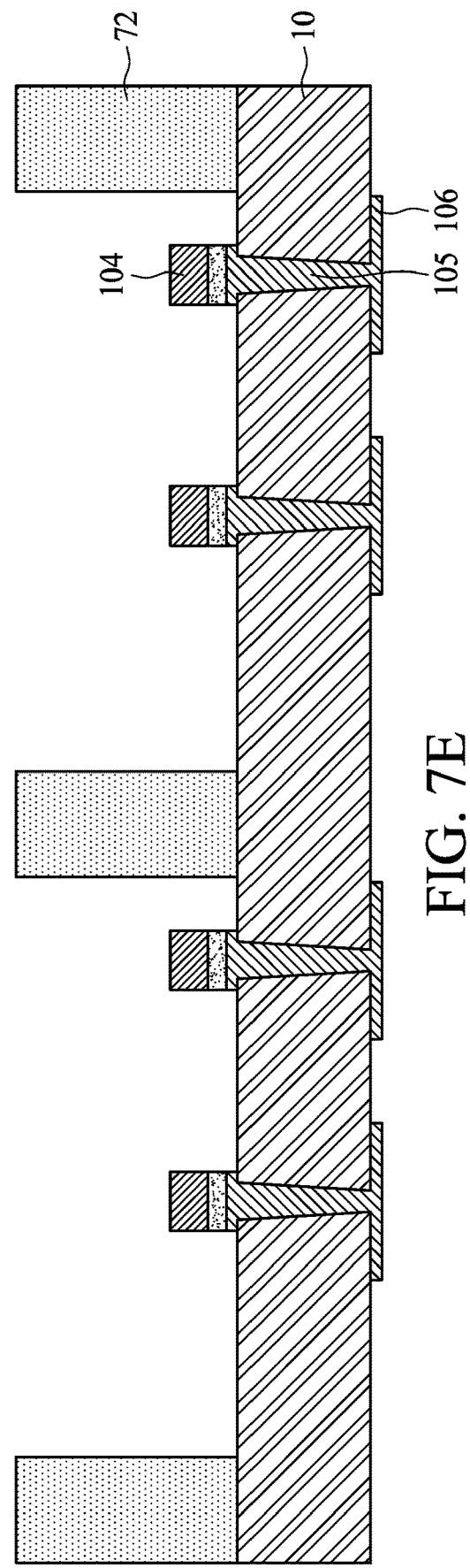
Figure 7F:
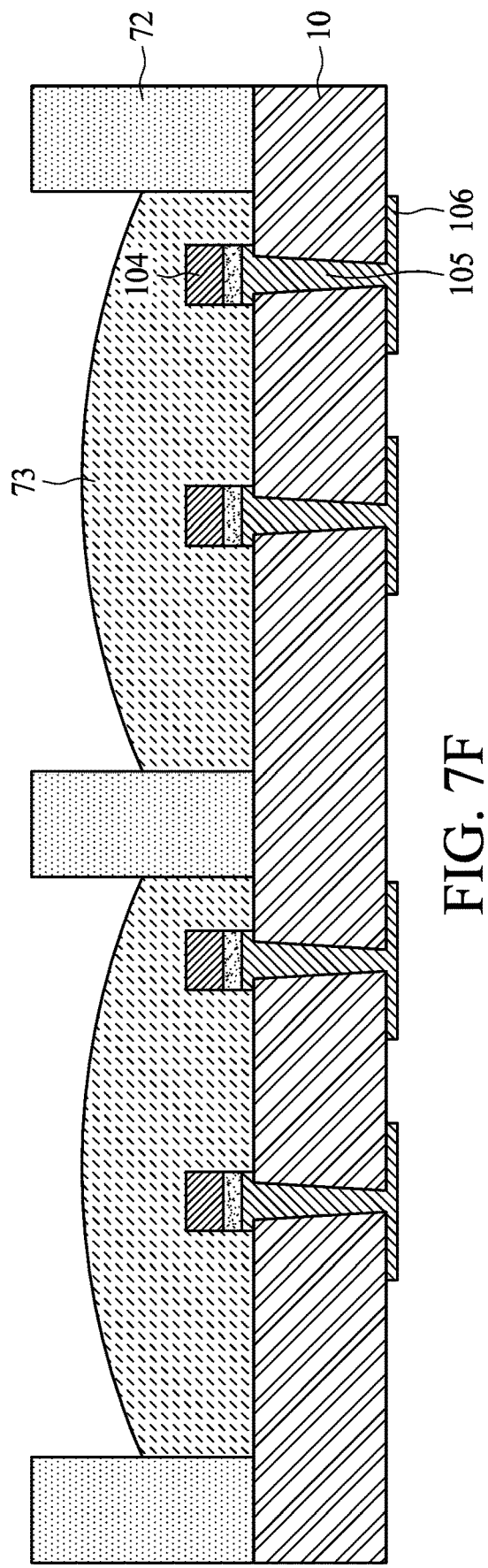
Figure 7G:
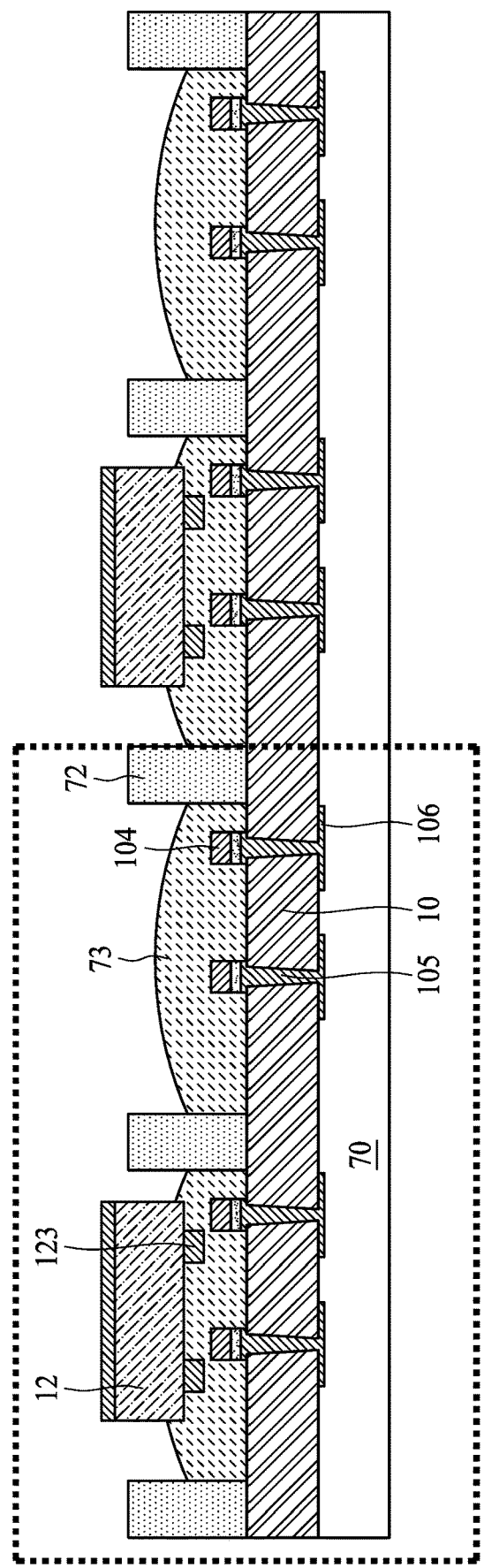
Figure 7H:
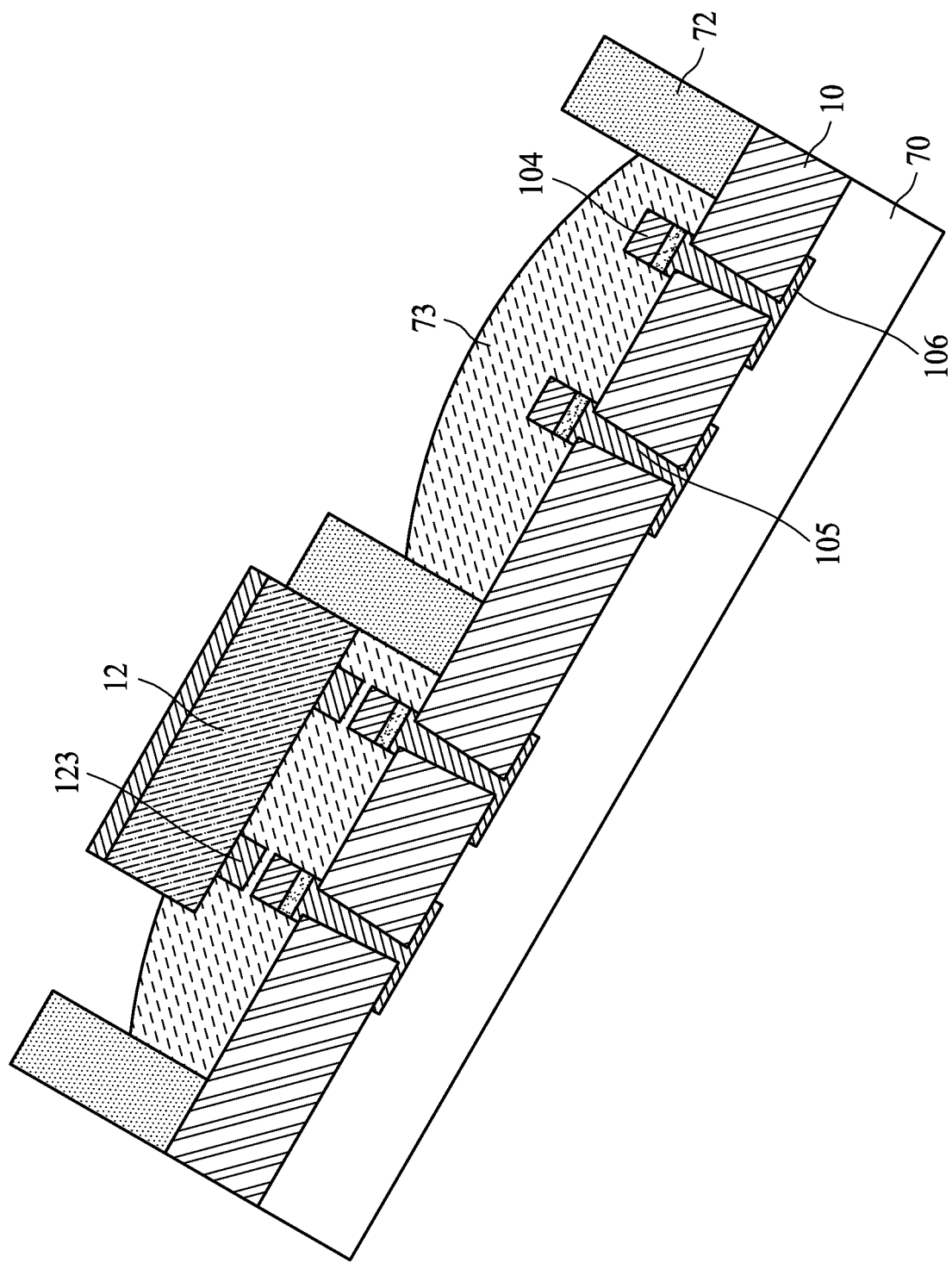
Figure 7I:
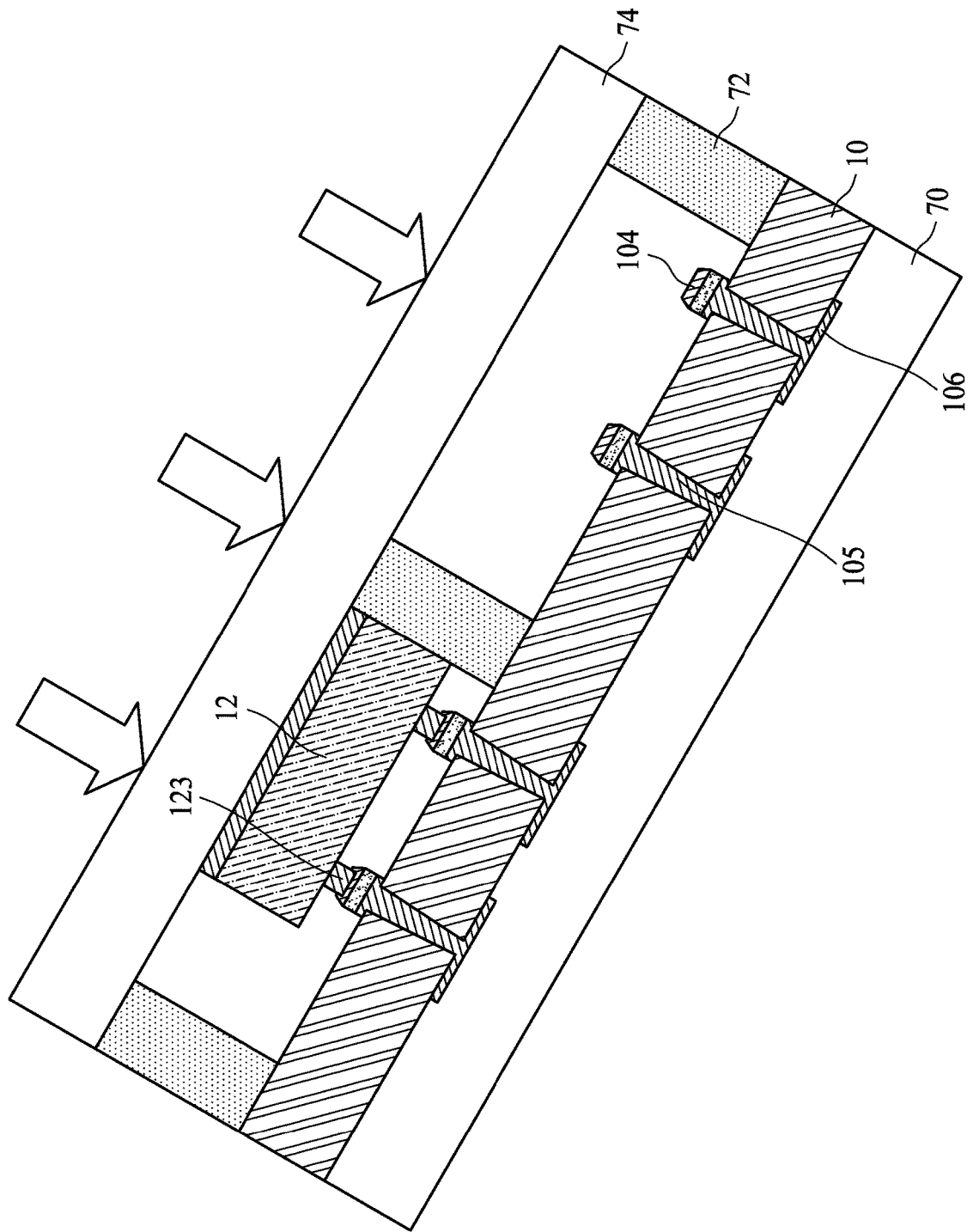
Figure 7J:
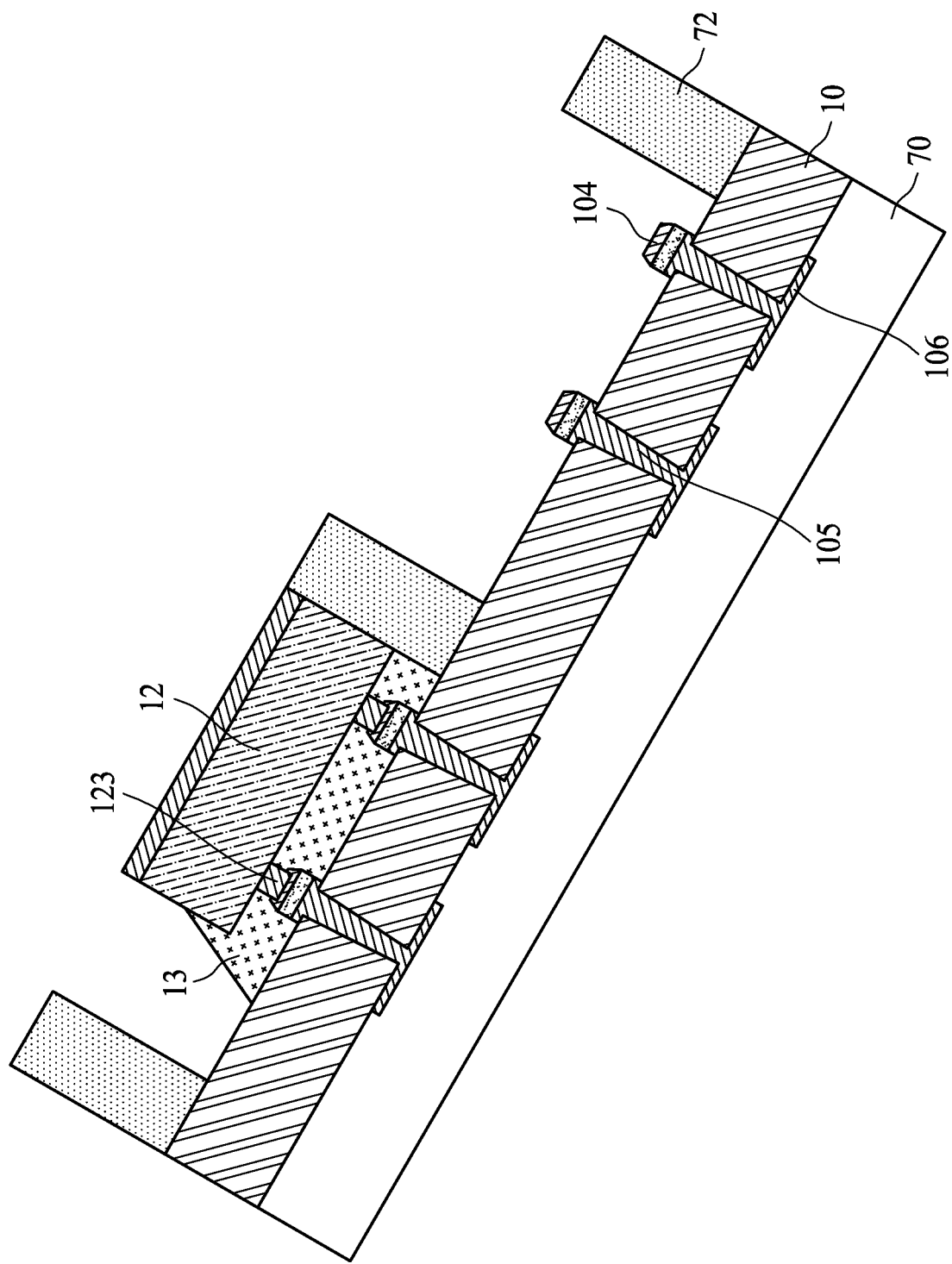
Figure 7K:
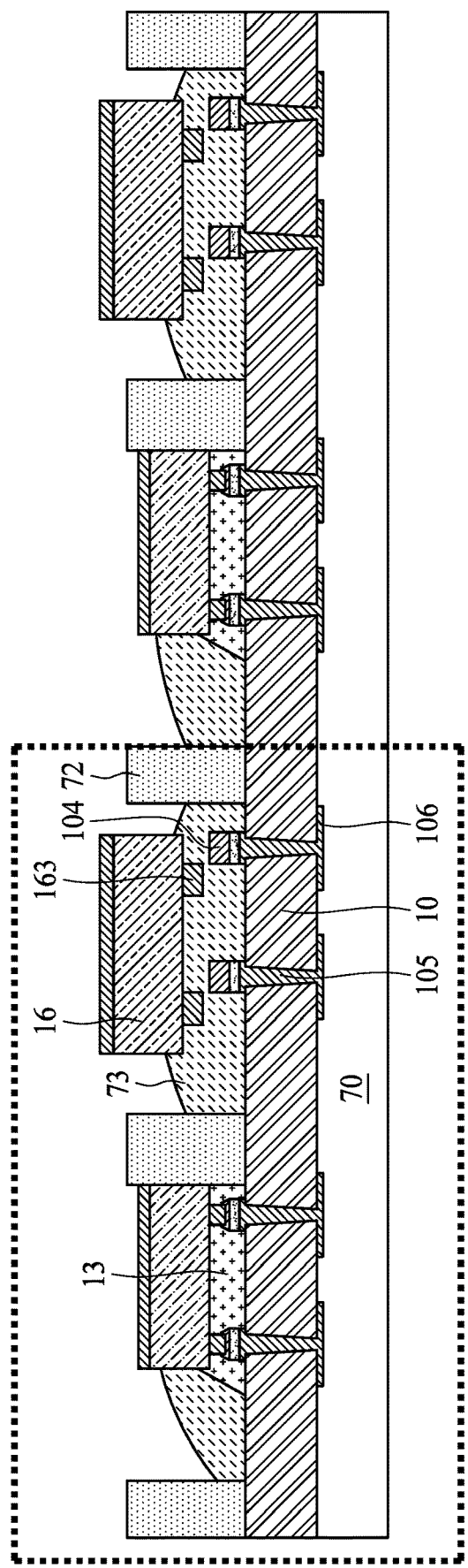
Figure 7L:
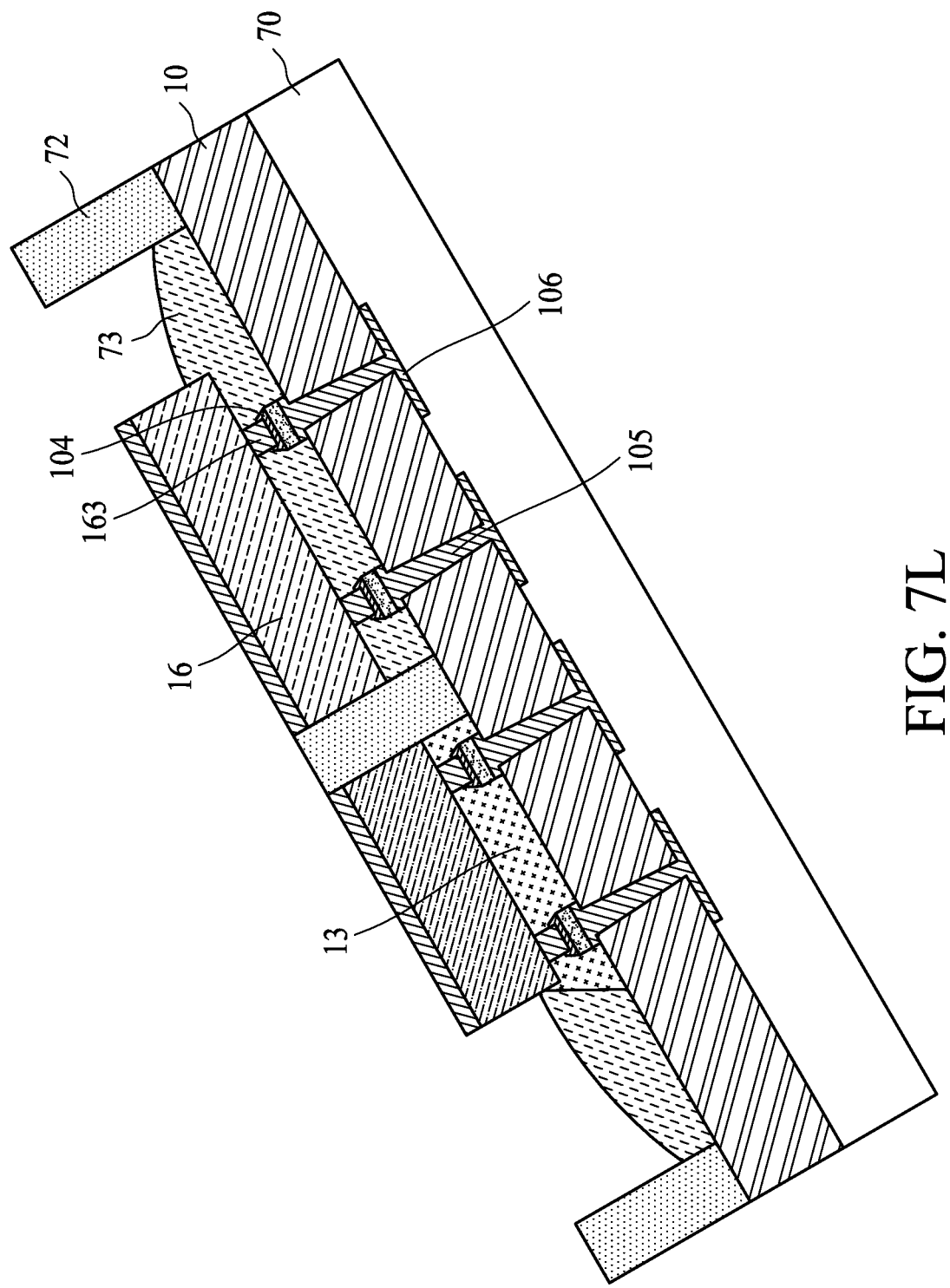
Figure 7M:
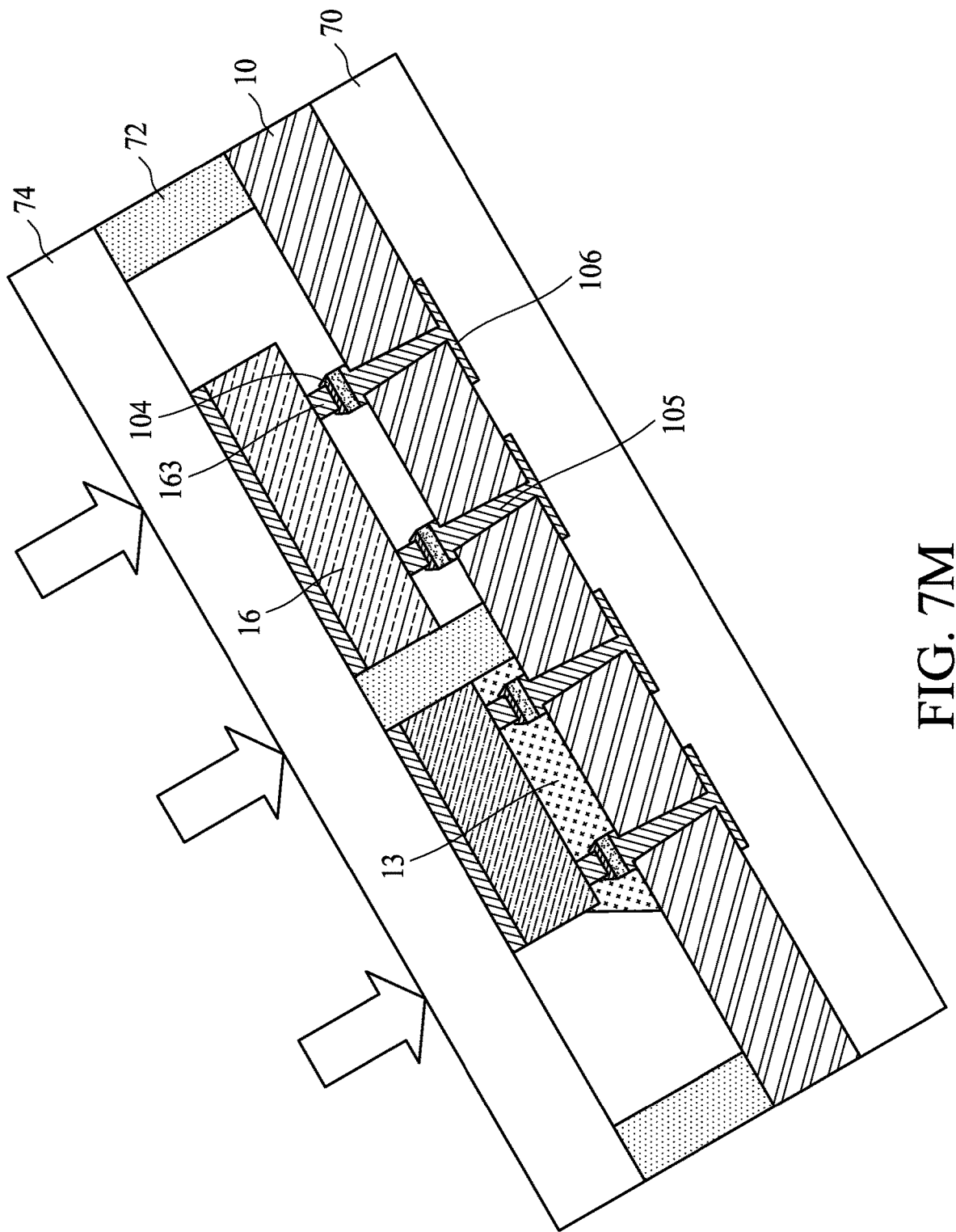
Figure 7N:
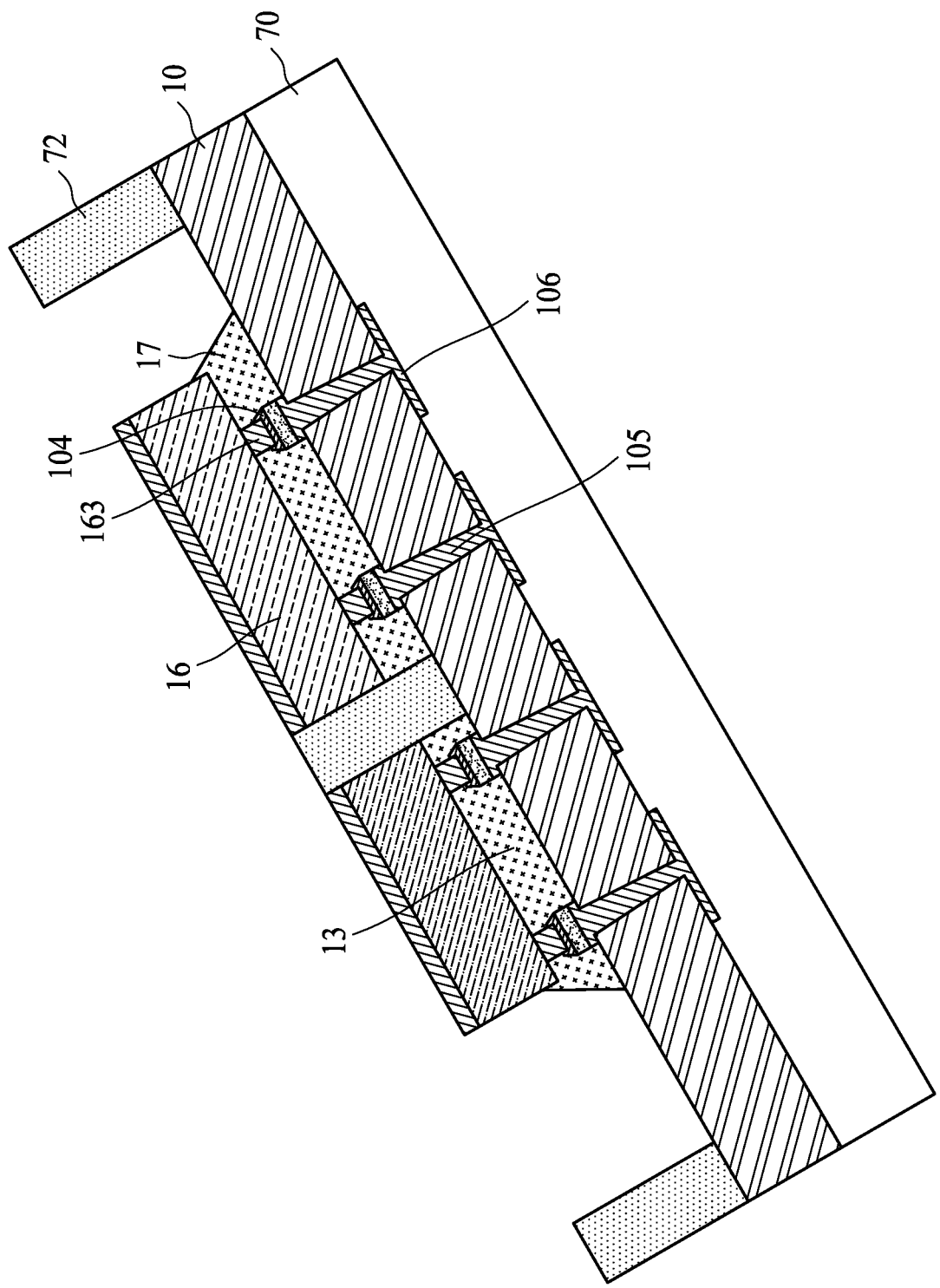
Figure 7O:
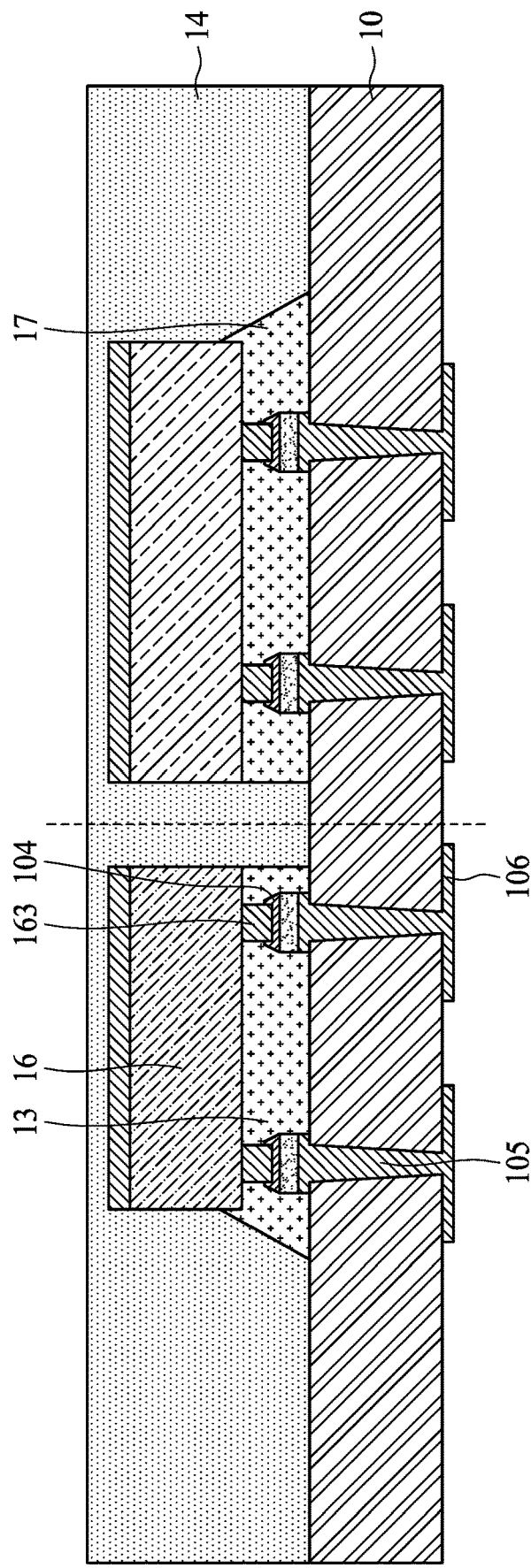
Figure 7P:
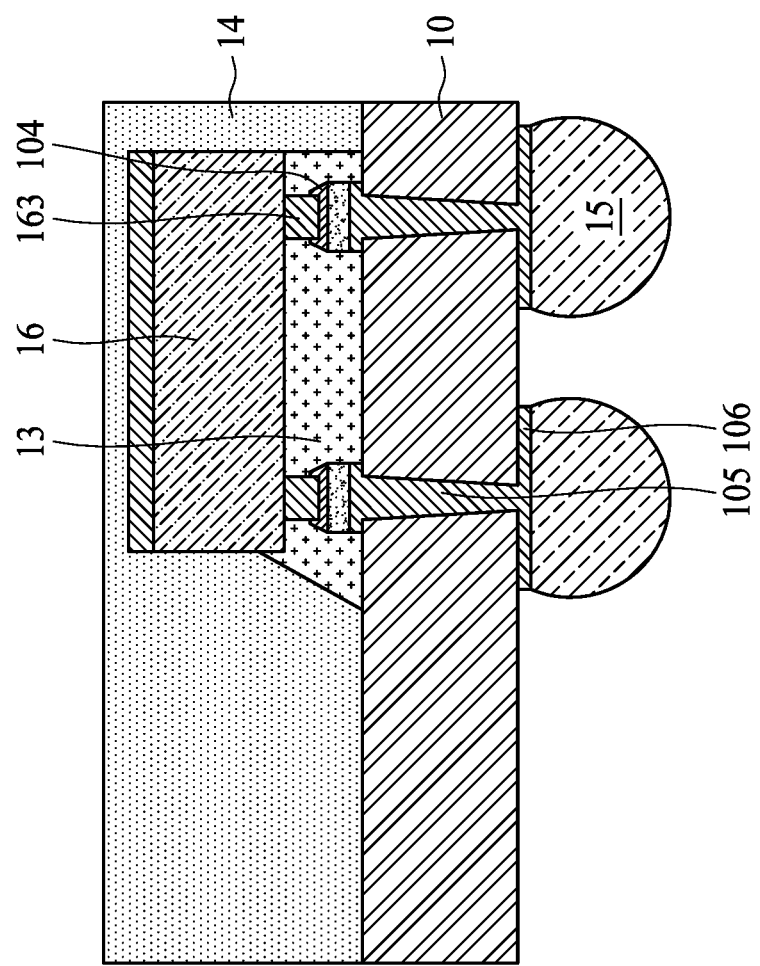

FIG. 7A through FIG. 7P illustrate some embodiments of a method of manufacturing the semiconductor device package 1 according to some embodiments of the present disclosure. Various figures have been simplified to more clearly present aspects of the present disclosure. The operations of the method of manufacturing the semiconductor device package 1 may be similarly applied to the semiconductor device packages of FIGS. 1B, 1C, 1D, 2A, 2B, 2C, 3, and 4.

Referring to FIG. 7A, the method for manufacturing the semiconductor device package 1 includes providing a substrate 10. A conductive film 104' is formed on an upper surface of the substrate 10. The substrate 10 includes an interconnection element 105 and a conductive pad 106 disposed on a lower surface of the substrate 10.

Referring to FIG. 7B, a photoresist 71 is applied to the upper surface of the substrate 10. The photoresist 71 is patterned to form an opening 71' by a lithographic operation. A conductive film 104" is formed in the opening 71' by a plating operation. The conductive film 104" is formed on the conductive film 104'.

Referring to FIG. 7C, the photoresist 71 is removed. Subsequently, an etching operation is performed to form a conductive pad 104.

Referring to FIG. 7D, the photoresist 71 is further applied to the upper surface of the substrate 10.

Referring to FIG. 7E, the photoresist 71 is patterned to form an alignment structure 72 by a lithographic operation. The alignment structure 72 includes a photo sensitive material. The sidewalls of the alignment structure 72 are substantially perpendicular to the upper surface of the substrate 10. In some embodiments, the appearance (e.g. sidewalls) of the alignment structure 72 may be affected by the lithographic operation. For example, the appearance of the alignment structure 72 may be affected by different settings of pre-curing or developing of the lithographic operation. The sidewalls of the alignment structure 72 may be sloped or partially sloped.

The alignment structure 72 may be located on or adjacent to a predefined singulation path so as to prevent an underfill from bleeding to the predefined singulation path. The design of the alignment structure 72 may shorten the distance between two semiconductor devices such that the area of the substrate 10 may be effectively utilized. In some embodiments, the alignment structure 72 may be located on any desired location on the substrate 10.

Referring to FIG. 7F, a fluid 73 is injected or potted on the upper surface of the substrate 10. The fluid 73 is confined by the alignment structure 72. A density of the fluid 73 is greater than a density of a die. The fluid 73 may include dibromomethane, diiodomethane, dichloroethane, thallous formate, or other suitable materials.

Referring to FIG. 7G, the substrate 10 is placed on a holder 70. A semiconductor device 12 is picked and placed on the fluid 73. The semiconductor device 12 has a conductive pad 123. The conductive pad 123 may be used as an electrical connection structure. The density of the semiconductor device 12 is less than the density of the fluid 73. The semiconductor device 12 floats on the fluid 73. The semiconductor device 12 does not contact the conductive pad 104 of the substrate 10.

Referring to FIG. 7H, it shows an enlarged view of a region delimited by a dashed line in FIG. 7G. The substrate 10 on the holder 70 is tilted. The semiconductor device 12 on the fluid 73 drifts toward and against the alignment structure 72 due to gravity. The conductive pad 123 (e.g., the electrical connection structure) of the semiconductor device 12 is aligned with the conductive pad 104 of the substrate 10. The alignment structure 72 functions as an alignment element to facilitate the conductive pad 123 of the semiconductor device 12 to align with the conductive pad 104 of the substrate 10.

The substrate 10 is further ultrasonically oscillated to make sure the semiconductor device 12 drifts toward and against the alignment structure 72. The conductive pad 123 of the semiconductor device 12 is not in contact with the conductive pad 104 of the substrate 10.

Referring to FIG. 7I, the fluid 73 is removed. The conductive pad 123 of the semiconductor device 12 is in contact with the conductive pad 104 of the substrate 10. Subsequently, a pressing element 74 is provided on the semiconductor device 12. The semiconductor device 12 is bonded to the substrate 10 through a pressure applied on the pressing element 74. The conductive pad 123 of the semiconductor device 12 is bonded to the conductive pad 104 of the substrate 10. A heat operation is performed at the same time. In some embodiments, the heat operation may be performed after the above pressing operation.

The alignment structure 72 functions as a stopper to support the semiconductor device 12 to prevent the conductive pad 123 of the semiconductor device 12 or the conductive pad 104 of the substrate 10 from cracking.

Referring to FIG. 7J, an underfill 13 is applied between the semiconductor device 12 and the substrate 10. The right sidewall of the underfill 13 and the right sidewall of the semiconductor device 12 are coplanar. Since the substrate 10 is tilted, the underfill 13 easily fills between the semiconductor device 12 and the substrate 10 and the volume of the left portion of the underfill 13 may be controlled to be as small as possible due to gravity.

Referring to FIG. 7K, the fluid 73 is further injected or potted on the upper surface of the substrate 10. A semiconductor device 16 is picked and placed on the fluid 73. The semiconductor device 16 has a conductive pad 163. The conductive pad 163 may be used as an electrical connection structure. The density of the semiconductor device 16 is less than the density of the fluid 73. The semiconductor device 16 floats on the fluid 73. The semiconductor device 16 does not contact the conductive pad 104 of the substrate 10.

Referring to FIG. 7L, it shows an enlarged view of a region delimited by a dashed line in FIG. 7K. The substrate 10 on the holder 70 is tilted. The semiconductor device 16 on the fluid 73 drifts toward and against the alignment structure 72 due to gravity. The conductive pad 163 (e.g., the electrical connection structure) of the semiconductor device 16 is aligned with the conductive pad 104 of the substrate 10. The alignment structure 72 functions as an alignment element to facilitate the conductive pad 163 of the semiconductor device 16 to align with the conductive pad 104 of the substrate 10.

The substrate 10 is further ultrasonically oscillated to make sure the semiconductor device 16 drifts toward and against the alignment structure 72. The conductive pad 163 of the semiconductor device 16 is not in contact with the conductive pad 104 of the substrate 10.

Referring to FIG. 7M, the fluid 73 is removed. The pressing operation and the heating operation are performed similarly to those performed of FIG. 7I.

Referring to FIG. 7N, an underfill 17 is applied between the semiconductor device 16 and the substrate 10. The left sidewall of the underfill 17 and the left sidewall of the semiconductor device 16 are coplanar.

Referring to FIG. 7O, the alignment structure 72 is removed. Subsequently, an encapsulant 14 is applied on the substrate 10. The encapsulant 14 encapsulates the semiconductor devices 12 and 16 and the underfills 13 and 17. Then, a singulation operation is performed through the predefined singulation path.

Referring to FIG. 7P, a conductive element 15 is formed on the conductive pad 106 disposed on the lower surface of the substrate 10.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a substrate including a conductive layer;
a first semiconductor device disposed on the substrate, the first semiconductor device including a first lateral surface substantially perpendicular to the substrate;
a first underfill disposed between the substrate and the first semiconductor device, the first underfill including a first lateral surface substantially coplanar to the first lateral surface of the first semiconductor device;
a second semiconductor device disposed on the substrate, the second semiconductor device including a first lateral surface substantially perpendicular to the substrate;
a second underfill disposed between the substrate and the second semiconductor device, the second underfill including a first lateral surface substantially coplanar to the first lateral surface of the second semiconductor device;
a first encapsulant encapsulating the first semiconductor device, the second semiconductor device, the first underfill and the second underfill;
a third semiconductor device disposed on the first encapsulant, the third semiconductor device including a first lateral surface substantially perpendicular to the first encapsulant;
a third underfill disposed between the first encapsulant and the third semiconductor device, the third underfill including a first lateral surface substantially coplanar to the first lateral surface of the third semiconductor device;
a fourth semiconductor device disposed on the first encapsulant, the fourth semiconductor device including a first lateral surface substantially perpendicular to the first encapsulant; and
a fourth underfill disposed between the first encapsulant and the fourth semiconductor device, the fourth underfill including a first lateral surface substantially coplanar to the first lateral surface of the fourth semiconductor device,
wherein at least one interconnection element is disposed in the first encapsulant and electrically connected to the substrate.

2. The semiconductor device package of claim 1, wherein the first semiconductor device and the second semiconductor device are electrically connected through the conductive layer of the substrate.

3. The semiconductor device package of claim 1, wherein a second lateral surface of the first underfill opposite to the first lateral surface partially covers a second lateral surface of the first semiconductor device opposite to the first lateral surface or a second lateral surface opposite to the first lateral surface of the second underfill partially covers a second lateral surface opposite to the first lateral surface of the second semiconductor device.

4. The semiconductor device package of claim 1, wherein
the first semiconductor device includes a second lateral surface opposite to the first lateral surface of the first semiconductor device,
the first underfill includes a second lateral surface opposite to the first lateral surface of the first underfill, and
the second lateral surface of the first underfill is slanted with respect to the second lateral surface of the first semiconductor device.

5. The semiconductor device package of claim 1, wherein
the second semiconductor device includes a second lateral surface opposite to the first lateral surface of the second semiconductor device,
the second underfill includes a second lateral surface opposite to the first lateral surface of the second underfill, and
the second lateral surface of the second underfill is slanted with respect to the second lateral surface of the second semiconductor device.

6. The semiconductor device package of claim 1, wherein the first and second semiconductor devices are flip-chip type semiconductor devices.

7. The semiconductor device package of claim 1, wherein
a second lateral surface of the third underfill opposite to the first lateral surface partially covers a second lateral surface of the third semiconductor device opposite to the first lateral surface or a second lateral surface opposite to the first lateral surface of the fourth underfill partially covers a second lateral surface opposite to the first lateral surface of the fourth semiconductor device.

8. The semiconductor device package of claim 1, wherein
the third semiconductor device includes a second lateral surface opposite to the first lateral surface of the third semiconductor device,
the third underfill includes a second lateral surface opposite to the first lateral surface of the third underfill, and
the second lateral surface of the third underfill is slanted with respect to the second lateral surface of the third semiconductor device.

9. The semiconductor device package of claim 1, wherein
the fourth semiconductor device includes a second lateral surface opposite to the first lateral surface of the fourth semiconductor device,
the fourth underfill includes a second lateral surface opposite to the first lateral surface of the fourth underfill, and
the second lateral surface of the fourth underfill is slanted with respect to the second lateral surface of the fourth semiconductor device.

10. The semiconductor device package of claim 1, wherein the third and fourth semiconductor devices are flip-chip type semiconductor devices.

11. The semiconductor device package of claim 1, wherein the third and fourth semiconductor devices are electrically connected through the at least one interconnection element.

12. The semiconductor device package of claim 11, wherein the third and fourth semiconductor devices are electrically connected through the conductive layer of the substrate.

13. The semiconductor device package of claim 11, wherein the first, second, third and fourth semiconductor devices are electrically connected through the conductive layer of the substrate.

14. The semiconductor device package of claim 1, further comprising a second encapsulant encapsulating the third and fourth semiconductor devices and the third and fourth underfills.

15. The semiconductor device package of claim 14, wherein a backside of the third semiconductor device or a backside of the fourth semiconductor device is exposed from the second encapsulant.

16. The semiconductor device package of claim 1, wherein
the first underfill includes a second lateral surface opposite to the first lateral surface of the first underfill, and the first and second lateral surfaces of the first underfill are non-parallel to each other.

17. The semiconductor device package of claim 1, wherein the third underfill includes a second lateral surface opposite to the first lateral surface of the first underfill, and the first and second lateral surfaces of the third underfill are non-parallel to each other.

\* \* \* \* \*